(12) United States Patent
Kawamori et al.

(10) Patent No.: US 11,722,112 B2
(45) Date of Patent: Aug. 8, 2023

(54) MANUFACTURING METHOD FOR ELECTRONIC COMPONENT

(71) Applicant: Murata Manufacturing Co., Ltd., Nagaokakyo (JP)

(72) Inventors: Shinsuke Kawamori, Nagaokakyo (JP); Masao Gamo, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 1049 days.

(21) Appl. No.: 16/513,865

(22) Filed: Jul. 17, 2019

(65) Prior Publication Data

US 2019/0341900 A1 Nov. 7, 2019

Related U.S. Application Data

(63) Continuation of application No. PCT/JP2018/001689, filed on Jan. 19, 2018.

(30) Foreign Application Priority Data

Jan. 19, 2017 (JP) ................................ 2017-007734

(51) Int. Cl.
*H03H 3/02* (2006.01)
*H03H 9/215* (2006.01)
*H10N 30/073* (2023.01)

(52) U.S. Cl.
CPC .............. *H03H 3/02* (2013.01); *H03H 9/215* (2013.01); *H10N 30/073* (2023.02); *H03H 2003/026* (2013.01)

(58) Field of Classification Search
CPC .... H03H 3/02; H03H 9/215; H03H 2003/026; H03H 9/1021; H03H 9/177; H01L 41/313; H01L 23/02; H10N 30/73

USPC ........................................................ 228/123
See application file for complete search history.

(56) References Cited

U.S. PATENT DOCUMENTS

| 6,143,992 | A  | 11/2000 | Sato et al. |
| 7,863,101 | B2 | 1/2011  | Suzuki et al. |
| 8,299,859 | B2 | 10/2012 | Sato et al. |
| 9,132,494 | B2 | 9/2015  | Inoue et al. |

(Continued)

FOREIGN PATENT DOCUMENTS

| JP | H06326205 A | 11/1994 |
| JP | H07147348 A | 6/1995 |

(Continued)

OTHER PUBLICATIONS

International Search Report issued in PCT/JP2018/001689, dated Mar. 27, 2018.

(Continued)

*Primary Examiner* — Richard Tan
(74) *Attorney, Agent, or Firm* — ArentFox Schiff LLP

(57) ABSTRACT

A manufacturing method for an electronic component that includes a providing a base member on a first main surface of a first board, sandwiching the base member and a joining member paste between the first main surface of the first board and a transfer main surface of a transfer board, forming a joining member joined with the base member while the joining member paste is sandwiched by the first board and the transfer board, and peeling off the transfer board from the joining member joined with the base member.

30 Claims, 25 Drawing Sheets

(56) References Cited

U.S. PATENT DOCUMENTS

| | | | |
|---|---|---|---|
| 9,751,754 | B2 | 9/2017 | Kurashima et al. |
| 9,960,109 | B2 | 5/2018 | Minegishi |
| 2007/0164445 | A1 | 7/2007 | Ejima |
| 2009/0309213 | A1* | 12/2009 | Takahashi ........... H01L 23/4334 |
| | | | 438/122 |
| 2011/0133844 | A1 | 6/2011 | Sato et al. |
| 2012/0186864 | A1 | 7/2012 | Inoue et al. |
| 2013/0119541 | A1 | 5/2013 | Ikeda |
| 2014/0346930 | A1* | 11/2014 | Kohda ................ H01L 41/0533 |
| | | | 216/41 |
| 2016/0332870 | A1 | 11/2016 | Kurashima et al. |
| 2017/0358397 | A1* | 12/2017 | McConnell ............ H01G 4/002 |
| 2018/0079036 | A1* | 3/2018 | Tsuda .................... B23K 35/36 |

FOREIGN PATENT DOCUMENTS

| | | |
|---|---|---|
| JP | 2004179431 A | 6/2004 |
| JP | 2004186995 A | 7/2004 |
| JP | 2005259886 A | 9/2005 |
| JP | 2011142609 A | 7/2011 |
| JP | 2012164965 A | 8/2012 |
| JP | 2013211358 A | 10/2013 |
| JP | 2014011423 A | 1/2014 |
| JP | 2014027113 A | 2/2014 |
| JP | 2015153833 A | 8/2015 |
| JP | 2017011045 A | 1/2017 |
| WO | 2015111753 A1 | 7/2015 |

OTHER PUBLICATIONS

Written Opinion of the International Searching Authority issued in PCT/JP2018/001689, dated Mar. 27, 2018.

* cited by examiner

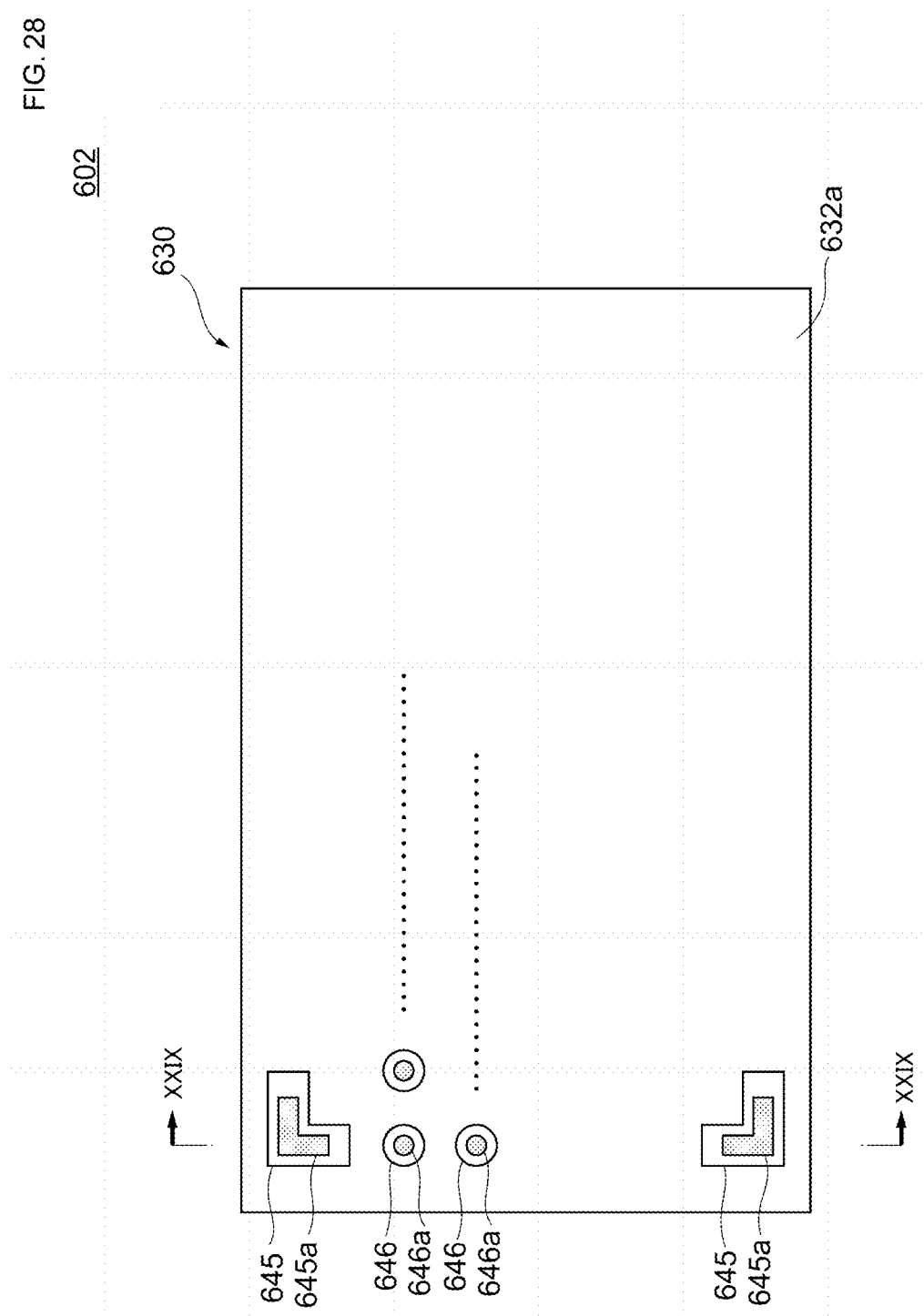

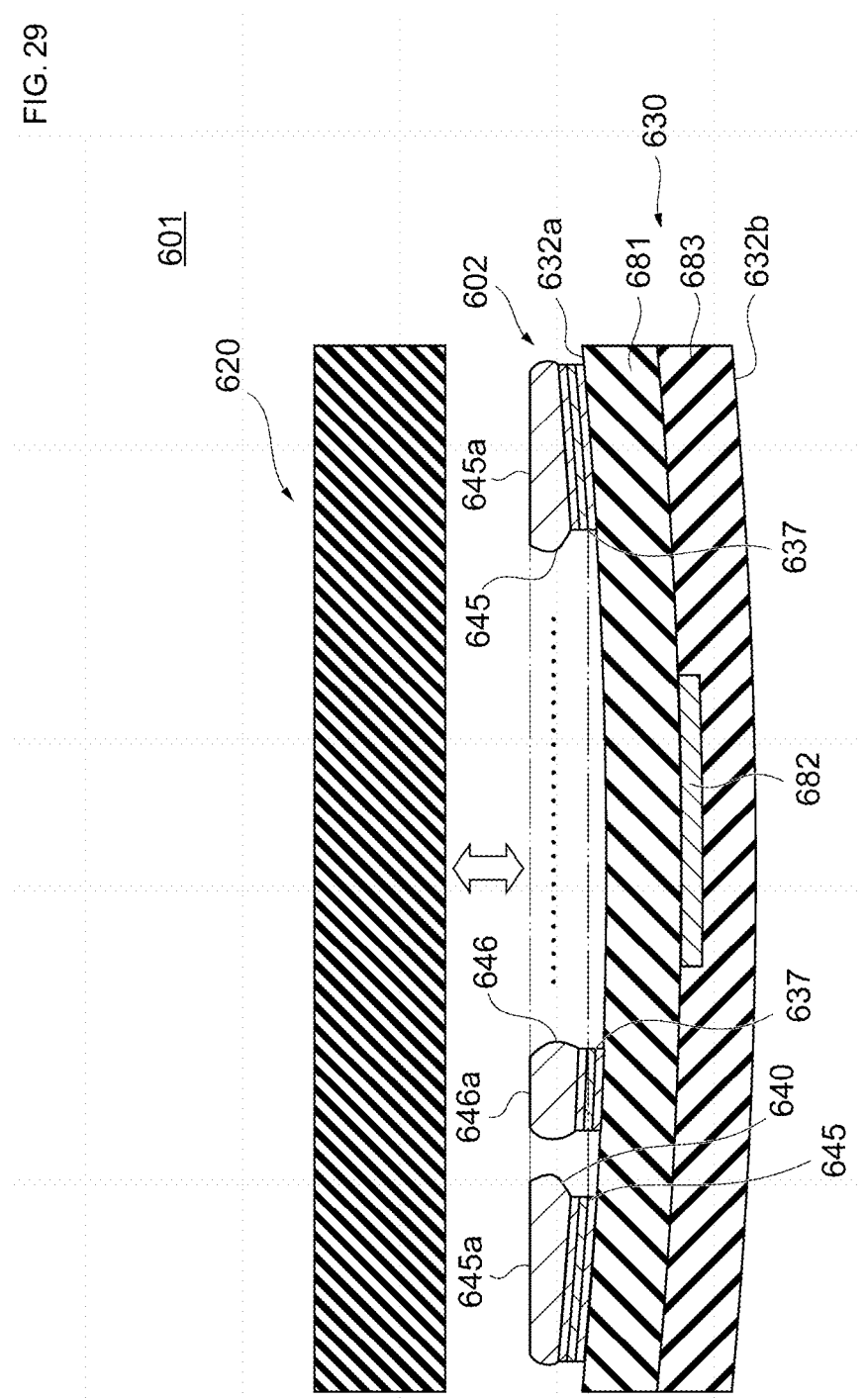

MANUFACTURING METHOD FOR ELECTRONIC COMPONENT

CROSS REFERENCE TO RELATED APPLICATIONS

The present application is a continuation of PCT/JP2018/001689 filed Jan. 19, 2018, which claims priority to Japanese Patent Application No. 2017-007734, filed Jan. 19, 2017, the entire contents of each of which are incorporated herein by reference.

TECHNICAL FIELD

The present invention relates to manufacturing method for an electronic component.

BACKGROUND

Quartz crystal resonator units made from, for example, artificial quartz are widely used as signal sources of reference signals that are used in oscillator devices, band-pass filters, and other devices. Patent Document 1 (identified below) describes a manufacturing method for a quartz crystal resonator unit. In the manufacturing method, a frame-shaped low-temperature metal brazing material (Au/Sn alloy) is put on a metallized layer of a ceramic board and melted to cover the metallized layer to form a joining layer, and a cover is brazed to the ceramic board with the joining layer interposed therebetween. Patent Document 2 (also identified below) describes a quartz crystal resonator unit in which an opening end surface of a metal cover, which is joined with a ceramic board via a seal material (molten resin), is a flange having an inclined surface.

Patent Document 1: Japanese Unexamined Patent Application Publication No. 2004-186995.

Patent Document 2: Japanese Unexamined Patent Application Publication No. 2011-142609.

Quartz crystal resonator units are mounted on mobile communication devices or other devices as one type of electronic components. In recent years, for the purpose of applications to miniaturized, higher-performance mobile communication devices or other devices, quartz crystal resonator units also need to be miniaturized, reduced in weight, and improved in durability. However, with the configuration that a brazing material is provided on the metallized layer of the ceramic board, there occurs a problem that the shape of the brazing material becomes instable under the influence of a change in shape, such as the shape of warpage of the ceramic board. On the other hand, with the configuration that the metal cover is joined with the ceramic board with the molten resin interposed therebetween, there has been a problem that the shape of the molten resin becomes instable under the influence of a change in the shape of the ceramic board and the shape of the metal cover or the shape of the molten resin becomes instable depending on a molten condition.

SUMMARY OF THE INVENTION

The exemplary embodiments of the present invention have been made in view of the above-noted circumstances. Accordingly, it is an object of the exemplary embodiments of the present invention to provide a manufacturing method for an electronic component that stabilize the shape of a joining member.

Thus, a manufacturing method for an electronic component according to one exemplary aspect of the present invention includes a first process of providing a base member on a first main surface of a first board, a second process of sandwiching the base member and joining member paste by the first main surface of the first board and a transfer main surface of a transfer board, a third process of forming a joining member joined with the base member while the joining member paste is sandwiched by the first board and the transfer board, and a fourth process of peeling off the transfer board from the joining member joined with the base member.

A manufacturing method for an electronic component according to another exemplary aspect of the present invention includes a first process of providing a base member on a first main surface of a first board, a second process of sandwiching the base member and joining member paste by the first main surface of the first board and a transfer main surface of a transfer board, a third process of forming a joining member through softening and solidification of the joining member paste by heating and cooling the joining member paste while the joining member paste is sandwiched by the first board and the transfer board, and a fourth process of peeling off the transfer board from the joining member joined with the base member.

According to the exemplary embodiments of the present invention, a manufacturing method for an electronic component are provided that stabilize the shape of a joining member.

BRIEF DESCRIPTION OF DRAWINGS

FIG. 28 is a plan view that schematically shows the configuration of an electronic component according to a third embodiment.

FIG. 29 is a cross-sectional view that schematically shows the configuration of a cross section taken along the line XXIX-XXIX in FIG. 28.

DETAILED DESCRIPTION OF EMBODIMENTS

Figure 1:
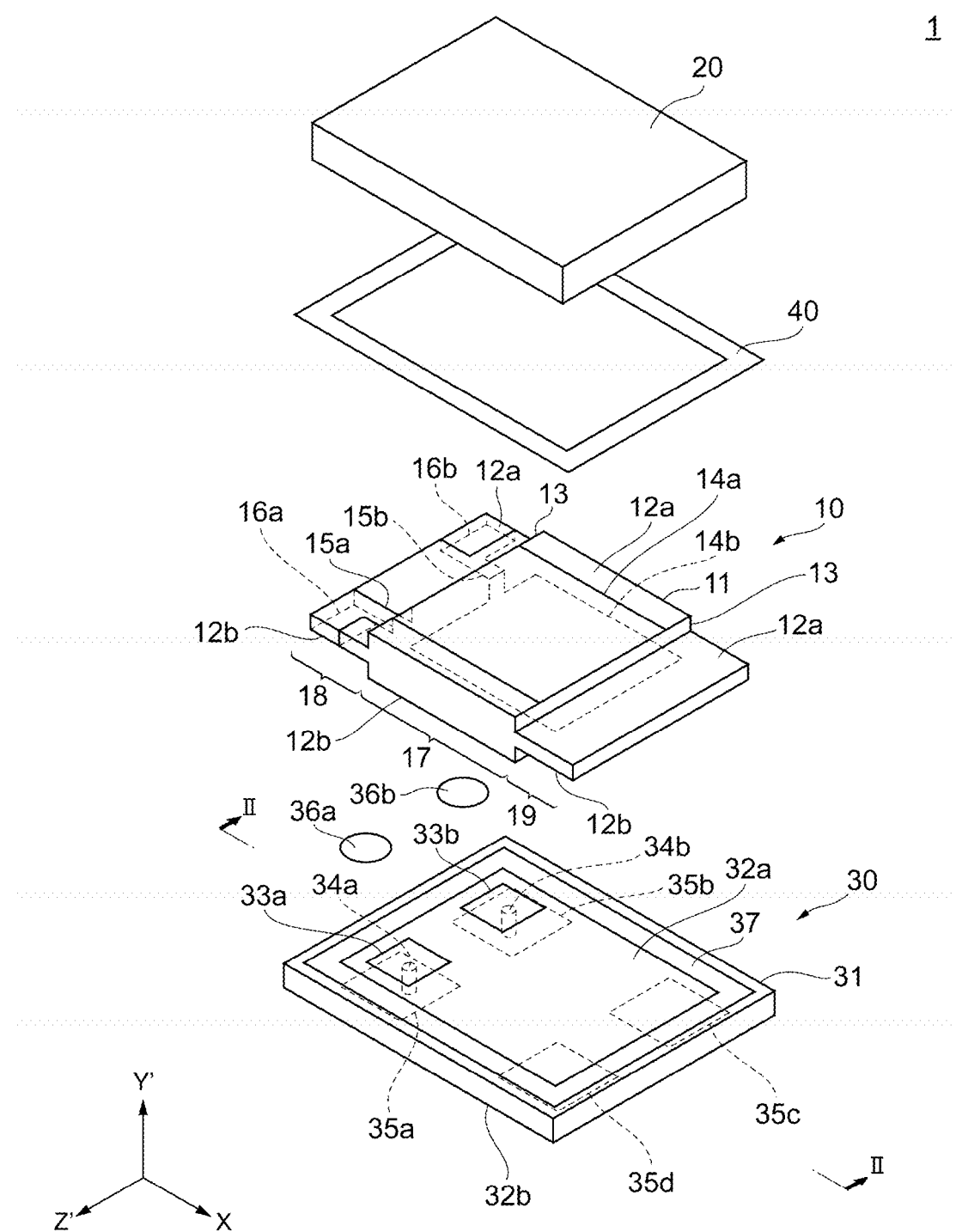
FIG. 1 is an exploded perspective view that shows an example of a quartz crystal resonator unit corresponding to an electronic component according to a first embodiment of the present invention.

Hereinafter, exemplary embodiments of the present invention will be described. It is noted that in the following description of the drawings, like or similar reference numerals denote the same or similar components. Moreover, the drawings are illustrative, the dimensions and shapes of portions are schematic ones, and the technical scope of the invention of the subject application should not be interpreted limitedly to the embodiments.

The following description will be made by taking a quartz crystal resonator unit including a quartz crystal resonator as an example of a piezoelectric resonator. The quartz crystal resonator uses a quartz crystal blank as a piezoelectric body that vibrates according to an applied voltage. However, it is noted that the piezoelectric resonator unit according to the exemplary embodiments of the present invention is not limited to a quartz crystal resonator unit, and may be the one that uses another piezoelectric body made of ceramics or other materials.

First Embodiment

Figure 2:
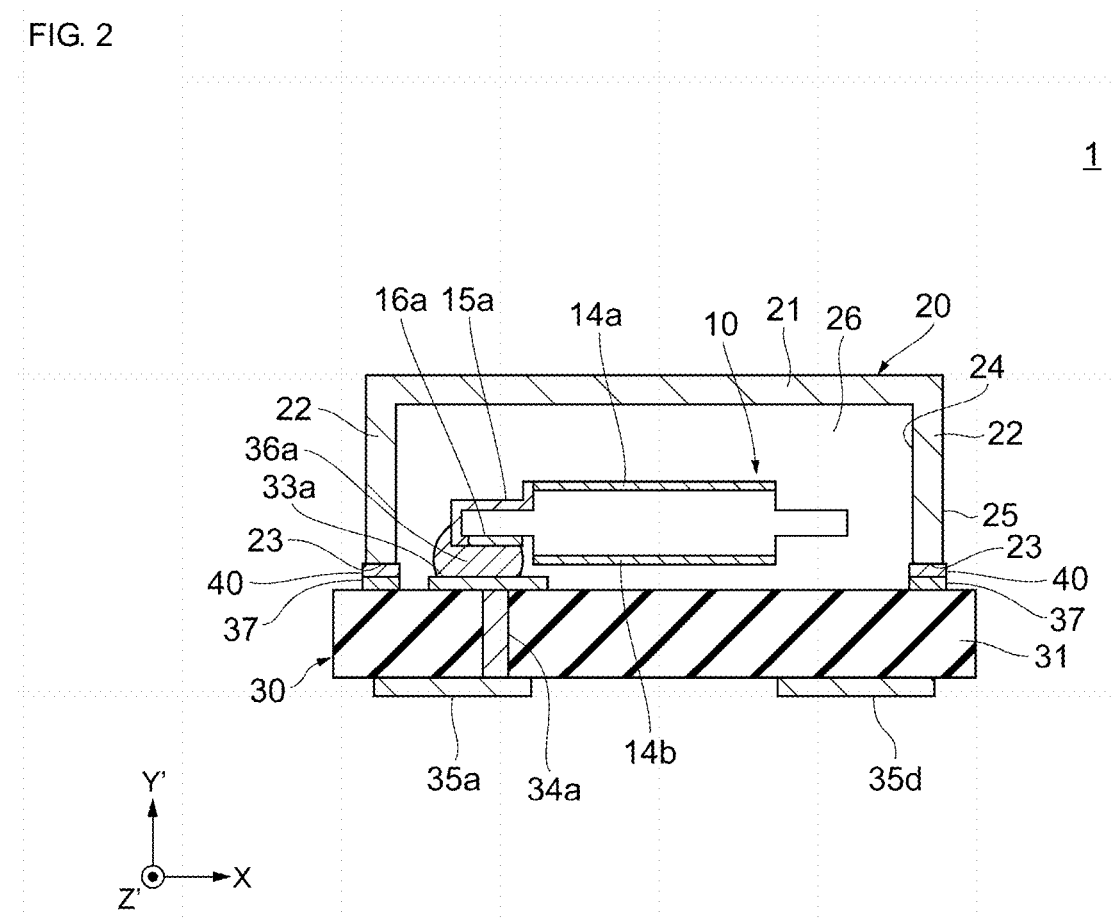
FIG. 2 is a cross-sectional view, taken along the line II-II, of the quartz crystal resonator unit shown in FIG. 1.

An example of a quartz crystal resonator unit that is manufactured in accordance with an exemplary embodiment of the present invention will be described with reference to FIG. 1 and FIG. 2. FIG. 1 is an exploded perspective view that shows an example of the quartz crystal resonator unit corresponding to an electronic component according to the first embodiment of the present invention. FIG. 2 is a cross-sectional view, taken along the line II-II, of the quartz crystal resonator unit shown in FIG. 1.

As shown in FIG. 1, the quartz crystal resonator unit 1 includes a quartz crystal resonator 10, a second board 20, and a first board 30. The first board 30 and the second board 20 make up a holder or frame for accommodating the quartz crystal resonator 10. In the exemplary embodiment, the second board 20 has a recessed shape, specifically, a box shape with an opening portion, and the first board 30 has a plate shape. It is noted that the shapes of the second board 20 and first board 30 are not limited to the above shapes. A first board having a recessed shape and a second board having a plate shape may be provided, or a first board and a second board both having a recessed shape may be provided. Moreover, the quartz crystal resonator unit 1 corresponds to the electronic component. The quartz crystal resonator 10 corresponds to an electronic element. It is further noted that the electronic element is not limited to a piezoelectric element, such as a quartz crystal resonator, as long as an electric signal, electric power, or the like, is input to or output from the electronic element. The electronic element may be, for example, an active element, a passive element, an integrated circuit, an imaging element, a display element, or another element, as should be appreciated to one skilled in the art.

The electronic component according to the embodiment of the present invention is not limited to a quartz crystal resonator unit as long as a first board and a second board are joined to each other with a joining member interposed therebetween. Here, the electronic component that uses a joining member as a sealing frame will be described. In another exemplary aspect, the electronic component may use a joining member as a terminal electrode. The electronic component may be a first board on which a joining member is formed, before being joined with a second board. In the following description, a component in which a first board and a second board are joined to each other with a joining member interposed therebetween is termed a first electronic component. Of components that make up the first electronic component, a first board-side component that includes the joining member and that is to be joined with the second board is termed a second electronic component.

The quartz crystal resonator 10 has a thin-piece quartz crystal blank 11. The quartz crystal blank 11 has a first main surface 12a and a second main surface 12b facing each other. The quartz crystal blank 11 is, for example, an AT-cut quartz crystal blank. The AT-cut quartz crystal blank is cut from artificial quartz with a plane parallel to a plane defined by an X-axis and a Z'-axis (hereinafter, referred to as XZ' plane; this also applies similarly to planes defined by other axes) being set as a main surface. The X-axis, a Y-axis, and a Z-axis are the crystal axes of the artificial quartz. A Y'-axis and the Z'-axis are axes respectively obtained by rotating the Y-axis and the Z-axis about the X-axis by 35 degrees 15 minutes±one minute 30 seconds in the direction from the Y-axis to the Z-axis. That is, in the AT-cut quartz crystal blank 11, the first main surface 12a and the second main surface 12b each correspond to the XZ' plane. It should be appreciated that different cuts (for example, BT cut or other cuts) other than the AT cut may be employed as the cut-angles of the quartz crystal blank.

According to the exemplary aspect, the AT-cut quartz crystal blank 11 has a long-side direction, a short-side direction, and a thickness direction. The long-side direction is a direction in which long sides parallel to the X-axis direction extend. The short-side direction is a direction in which short sides parallel to the Z'-axis direction extend. The thickness direction is a direction of thickness, parallel to the Y'-axis direction. The quartz crystal blank 11 has a substantially rectangular shape when viewed in plan in the direction of the normal to the first main surface 12a. The quartz crystal blank 11 has an excitation portion 17, a peripheral portion 18, and a peripheral portion 19. The excitation portion 17 is located at the center, and contributes to excitation. The peripheral portion 18 adjoins the excitation portion 17 on the negative side of the X-axis. The peripheral portion 19 adjoins the excitation portion 17 on the positive side of the X-axis. A step 13 is provided between the excitation portion 17 and the peripheral portion 19. The quartz crystal blank 11 has a mesa structure that the excitation portion 17 is thicker than the peripheral portions 18, 19. However, the shape of the quartz crystal blank 11 is not limited thereto. The quartz crystal blank 11 may have, for example, a combtooth structure that, when viewed in a plan view in the direction of the normal to the first main surface 12a, a pair of parallel arm portions and a coupling portion that couples the arm portions are provided. Alternatively, the quartz crystal blank 11 may have a planar structure that the thickness is substantially uniform in the X-axis direction and in the Z'-axis direction or may have a reverse-mesa structure that the excitation portion 17 is thinner than the peripheral portions 18, 19. Alternatively, the quartz crystal blank 11 may have a convex shape or a bevel shape that a change in the thickness between the excitation portion 17 and the peripheral portions 18, 19 is continuous.

In general, a quartz crystal resonator that uses an AT-cut quartz crystal blank has a high frequency stability in a wide temperature range and excellent aged deterioration characteristics, and can be manufactured at low cost. Moreover, an AT-cut quartz crystal resonator is used with a thickness shear vibration mode as a main vibration.

The quartz crystal resonator 10 includes a first excitation electrode 14a and a second excitation electrode 14b that make up a pair of electrodes. The first excitation electrode 14a is provided on the first main surface 12a of the excitation portion 17. The second excitation electrode 14b is provided on the second main surface 12b of the excitation portion 17. Accordingly, the first excitation electrode 14a and the second excitation electrode 14b are provided on opposite sides of the quartz crystal blank 11. The first excitation electrode 14a and the second excitation electrode 14b are disposed such that substantially the entire areas overlap each other in the XZ' plane.

Each of the first excitation electrode 14a and the second excitation electrode 14b has long sides parallel to the X-axis direction, short sides parallel to the Z'-axis direction, and a thickness parallel to the Y'-axis direction. In the example shown in FIG. 1, in the XZ' plane, the long sides of the first excitation electrode 14a and second excitation electrode 14b are parallel to the long sides of the quartz crystal blank 11, and the short sides of the first excitation electrode 14a and second excitation electrode 14b are parallel to the short sides of the quartz crystal blank 11. The long sides of the first excitation electrode 14a and second excitation electrode 14b are spaced apart from the long sides of the quartz crystal blank 11. The short sides of the first excitation electrode 14a and second excitation electrode 14b are spaced apart from the short sides of the quartz crystal blank 11.

As further shown, the quartz crystal resonator 10 includes a pair of extended electrodes 15a, 15b and a pair of connection electrodes 16a, 16b. The connection electrode 16a is electrically connected to the first excitation electrode 14a via the extended electrode 15a. The connection electrode 16b is electrically connected to the second excitation electrode 14b via the extended electrode 15b. The connection electrodes 16a, 16b are respective terminals for electrically connecting the first excitation electrode 14a and the second excitation electrode 14b to the first board 30. Moreover, the quartz crystal resonator 10 is held on the first board 30. The first main surface 12a is located on a side across from a side facing the first board 30. The second main surface 12b is located on the side facing the first board 30.

The extended electrode 15a is provided on the first main surface 12a. The extended electrode 15b is provided on the second main surface 12b. The connection electrode 16a is provided over the range from the first main surface 12a to second main surface 12b of the peripheral portion 18. The connection electrode 16b is provided over the range from the second main surface 12b to first main surface 12a of the peripheral portion 18. The first excitation electrode 14a, the extended electrode 15a, and the connection electrode 16a are continuous. Likewise, the second excitation electrode 14b, the extended electrode 15b, and the connection electrode 16b are continuous. In the configuration example shown in FIG. 1, the connection electrode 16a and the connection electrode 16b are disposed side by side along the short-side direction (Z'-axis direction) of the quartz crystal blank 11, and the quartz crystal resonator 10 has a so-called cantilever structure that the quartz crystal resonator 10 is held at one short side. The quartz crystal resonator 10 may have a so-called both-fixed structure that the quartz crystal resonator 10 is held at both short sides. In this case, one of the connection electrode 16a and the connection electrode 16b is provided on the peripheral portion 18, and the other one is provided on the peripheral portion 19.

It is noted that the material of the first excitation electrode 14a and second excitation electrode 14b is not specifically limited. For example, the first excitation electrode 14a and the second excitation electrode 14b have a chromium (Cr) layer as a base layer at a side that contacts with the quartz crystal blank 11, and have a gold (Au) layer at a side farther from the quartz crystal blank 11 than the base layer as a surface layer. The adhesion between the quartz crystal blank and the excitation electrode improves when a metal layer having a high reactivity with oxygen is provided as a base layer, and the deterioration of the excitation electrode is reduced and the electrical reliability improves when a metal layer having a low reactivity with oxygen is provided as a surface layer.

The second board 20 has a recessed shape and opens toward a first main surface 32a of the first board 30. The second board 20 is joined with the first board 30. As a result, the second board 20 accommodates the quartz crystal resonator 10 in an internal space 26, as shown in FIG. 2, for example. The shape of the second board 20 is not limited as long as the second board 20 can accommodate the quartz crystal resonator 10. For example, the second board 20 has a rectangular shape when viewed in plan in the direction of the normal to the main surface of a top portion 21. The second board 20 has, for example, a long-side direction, a short-side direction, and a height direction. The long-side direction is a direction in which long sides parallel to the X-axis direction extend. The short-side direction is a direction in which short sides parallel to the Z'-axis direction extend. The height direction is parallel to the Y'-axis direction.

As shown in FIG. 2, the second board 20 has an inner surface 24 and an outer surface 25. The inner surface 24 is an internal space 26-side surface. The outer surface 25 is a surface on the opposite side of the inner surface 24. The second board 20 has the top portion 21 and a side wall portion 22. The top portion 21 faces the first main surface 32*a* of the first board 30. The side wall portion 22 is connected to the outer edge of the top portion 21, and extends in a direction that intersects with the main surface of the top portion 21. The second board 20 has a facing surface 23 that faces the first main surface 32*a* of the first board 30 at an opening end portion (an end portion of the side wall portion 22 on a side close to the first board 30) of the recessed shape. That is, the facing surface 23 is included in the opening end portion. The facing surface 23 extends in a frame shape so as to surround the quartz crystal resonator 10.

It is noted that the material of the second board 20 is not specifically limited. For example, the second board 20 can be made of an electrically conductive material, such as a metal. With this configuration, when the second board 20 is electrically connected to a ground potential, a shield function is added. For example, the second board 20 is made of an alloy containing iron (Fe) and nickel (Ni) (for example, 42 alloy). A gold (Au) layer, or the like, that is intended for oxidation prevention, or the like, may be provided on the outermost surface of the second board 20. Alternatively, the second board 20 may be made of an electrically insulating material, and may have a composite structure of an electrically conductive material and an electrically insulating material.

The first board 30 holds the quartz crystal resonator 10 such that the quartz crystal resonator 10 can be excited. The first board 30 has a plate shape. The first board 30 has a long-side direction, a short-side direction, and a thickness direction. The long-side direction is a direction in which long sides parallel to the X-axis direction extend. The short-side direction is a direction in which short sides parallel to the Z'-axis direction extend. Moreover, the thickness direction is a direction of thickness, parallel to the Y'-axis direction.

The first board 30 comprises a substrate 31, and has the first main surface 32*a* and a second main surface 32*b* facing each other. The substrate 31 is, for example, a sintered material, such as electrically insulating ceramics (alumina). In this case, a plurality of electrically insulating ceramic sheet may be laminated and sintered. Alternatively, the substrate 31 may be made of an inorganic glass material (for example, silicate glass or a material mainly containing a substance other than silicate and exhibits a glass-transition phenomenon with an increase in temperature), a quartz crystal material (for example, AT-cut quartz crystal), heat-resistant engineering plastics (for example, polyimide or liquid crystal polymer), an organic-inorganic hybrid material (for example, fiber-reinforced plastics, such as glass epoxy resin), or the like. The substrate 31 is preferably made of a heat-resistant material. The substrate 31 may be a monolayer or may be a multilayer. In the case of a multilayer, the substrate 31 includes an electrically insulating layer formed on the outermost surface of the first main surface 32*a*.

The first board 30 includes electrode pads 33*a*, 33*b* provided on the first main surface 32*a* and outer electrodes 35*a*, 35*b*, 35*c*, 35*d* provided on the second main surface 32*b*. The electrode pads 33*a*, 33*b* are terminals for electrically connecting the first board 30 and the quartz crystal resonator 10. The outer electrodes 35*a*, 35*b*, 35*c*, 35*d* are terminals for electrically connecting a circuit board (not shown) and the quartz crystal resonator unit 1. The electrode pad 33*a* is electrically connected to the outer electrode 35*a* through a via electrode 34*a* that extends in the Y'-axis direction. The electrode pad 33*b* is electrically connected to the outer electrode 35*b* through a via electrode 34*b* that extends in the Y'-axis direction. The via electrodes 34*a*, 34*b* are formed in via holes that extend through the substrate 31 in the Y'-axis direction.

Electrically conductive holding members 36*a*, 36*b* respectively electrically connect the connection electrodes 16*a*, 16*b* of the quartz crystal resonator 10 to the electrode pads 33*a*, 33*b* of the first board 30. The electrically conductive holding members 36*a*, 36*b* hold the quartz crystal resonator 10 on the first main surface 32*a* of the first board 30 such that the quartz crystal resonator 10 can be excited. The electrically conductive holding members 36*a*, 36*b* are, for example, made from electrically conductive adhesive containing a thermoset resin, an ultraviolet curing resin, or the like, and contain a filler for keeping a space between the first board and the quartz crystal resonator, electrically conductive particles for imparting electrical conductivity to the electrically conductive holding members, or other materials.

In the configuration example shown in FIG. 1, the electrode pads 33*a*, 33*b* of the first board 30 are provided on the first main surface 32*a* near the X-axis negative-side short side of the first board 30, and are arranged along the short-side direction. The electrode pad 33*a* is connected to the connection electrode 16*a* of the quartz crystal resonator 10 via the electrically conductive holding member 36*a*. On the other hand, the electrode pad 33*b* is connected to the connection electrode 16*b* of the quartz crystal resonator 10 via the electrically conductive holding member 36*b*.

The outer electrodes 35*a*, 35*b*, 35*c*, 35*d* are respectively provided near the corners of the second main surface 32*b*. In the example shown in FIG. 1, the outer electrodes 35*a*, 35*b* are respectively disposed directly below the electrode pads 33*a*, 33*b*. Thus, the outer electrodes 35*a*, 35*b* are electrically connected to the electrode pads 33*a*, 33*b* by the via electrodes 34*a*, 34*b* that extend in the Y'-axis direction. In the example shown in FIG. 1, of the four outer electrodes 35*a* to 35*d*, the outer electrodes 35*a*, 35*b* disposed near the X-axis negative-side short side of the first board 30 are input/output electrodes to or from which input/output signals of the quartz crystal resonator 10 are supplied. The outer electrodes 35*c*, 35*d* disposed near the X-axis positive-side short side of the first board 30 are dummy electrodes to or from which input/output signals of the quartz crystal resonator 10 are not supplied. Such dummy electrodes are not supplied with input/output signals of the other electronic elements on the circuit board (not shown) on which the quartz crystal resonator unit 1 is mounted. Alternatively, the outer electrodes 35*c*, 35*d* may be grounding electrodes to which a ground potential is supplied. When the second board 20 is made of an electrically conductive material, an electromagnetic shield function having a high shielding performance can be added when the second board 20 is connected to the outer electrodes 35c, 35d that are configured as the grounding electrodes.

A base member 37 is provided on the first main surface 32a of the first board 30. In the example shown in FIG. 1, the base member 37 has a rectangular frame shape when viewed in plan in the direction of the normal to the first main surface 32a. When viewed in plan in the direction of the normal to the first main surface 32a, the electrode pads 33a, 33b are disposed inside the base member 37, and the base member 37 is provided so as to surround the quartz crystal resonator 10. The base member 37 is made of an electrically conductive material. For example, when the base member 37 is made of the same material as the electrode pads 33a, 33b, the base member 37 can be provided at the same time in a process of providing the electrode pads 33a, 33b. A joining member 40 (described later) is provided on the base member 37. Thus, the second board 20 is joined with the first board 30 with the joining member 40 and the base member 37 interposed therebetween.

According to the exemplary embodiment, the electrode pads 33a, 33b, outer electrodes 35a to 35d, and base member 37 of the first board 30 all are made from metal films. For example, the electrode pads 33a, 33b, the outer electrodes 35a to 35d, and the base member 37 each are made by laminating a molybdenum (Mo) layer, a nickel (Ni) layer, and a gold (Au) layer in this order from a side closer to the substrate 31 (lower layer) to a far side (upper layer). In the base member 37, the Mo layer corresponds to a close contact layer (described later), and the Ni layer and the Au layer correspond to a base layer (described later). The via electrodes 34a, 34b can be formed by filling the via holes of the substrate 31 with electrically conductive paste. Moreover, the electrically conductive paste can be a pasty composite material composed of high-melting point metal powder, such as molybdenum (Mo), and an additive material, such as flux.

Disposition of the electrode pads 33a, 33b, and outer electrodes 35a to 35d is not limited to the above example. For example, the electrode pad 33a may be disposed near one short side of the first board 30, and the electrode pad 33b may be disposed near the other short side of the first board 30. With such a configuration, the quartz crystal resonator 10 is held by the first board 30 at both end portions of the quartz crystal blank 11 in the long-side direction.

Disposition of the outer electrodes is not limited to the above example. For example, the two input/output electrodes may be provided diagonally on the second main surface 32b. Alternatively, the four outer electrodes may be disposed not at the corners of the second main surface 32b but near the centers of the sides. The number of outer electrodes is not limited to four, and may be, for example, only two of input/output electrodes. The mode of electrical connection between the connection electrodes and outer electrodes is not limited to the electrical connection using the via electrodes. Electrical continuity of those electrodes may be achieved by extending electrodes onto the first main surface 32a or the second main surface 32b. Alternatively, electrical connection between the connection electrodes and the outer electrodes may be achieved by forming the substrate 31 of the first board 30 in multiple layers, extending the via electrodes to an intermediate layer, and extending electrodes in the intermediate layer.

Since both the second board 20 and the first board 30 are joined with each other with the base member 37 and the joining member 40 interposed therebetween, the quartz crystal resonator 10 is encapsulated in the internal space (cavity) 26 surrounded by the second board 20 and the first board 30. In this case, the pressure in the internal space 26 is preferably a vacuum state lower in pressure than atmospheric pressure. Advantageously, this configuration reduces, for example, aged deterioration in the frequency characteristics of the quartz crystal resonator unit 1 due to oxidation of the first excitation electrode 14a and second excitation electrode 14b.

The joining member 40 is disposed all around the second board 20 and the first board 30. Specifically, the joining member 40 is provided on the base member 37, and is formed in a closed frame shape. Since the base member 37 and the joining member 40 are interposed between the facing surface 23 of the side wall portion 22 of the second board 20 and the first main surface 32a of the first board 30, the quartz crystal resonator 10 is encapsulated by the second board 20 and the first board 30.

According to an exemplary aspect, the joining member 40 is a brazing member resulting from aggregation of metallic material in joining member paste that is a pasty composite material composed of metal powder and an additive material, such as flux. Specifically, the joining member 40 is made of a gold (Au)-tin (Sn) eutectic alloy. Thus, the second board 20 and the first board 30 are joined by metal. Metal joining improves sealability. It is noted that the joining member 40 is not limited to an electrically conductive material, and may be an electrically insulating material such as a glass adhesive material, for example, a low melting glass (for example, lead borates, tin phosphates, and the like) according to alternative aspects. With this configuration, the cost is low as compared to metal joining, the heating temperature is decreased, and the manufacturing process is simplified.

In the quartz crystal resonator 10 according to the present embodiment, one end of the quartz crystal blank 11 in the long-side direction (the end portion at which the electrically conductive holding members 36a, 36b are disposed) is a fixed end, and the other end is a free end. The quartz crystal resonator 10, the second board 20, and the first board 30 each have a rectangular shape in the XZ' plane, and each have the same long-side direction and the same short-side direction.

However, it is noted that the position of the fixed end of the quartz crystal resonator 10 is not specifically limited. The quartz crystal resonator 10 may be fixed to the first board 30 at both ends of the quartz crystal blank 11 in the long-side direction. In this case, the electrodes of the quartz crystal resonator 10 and first board 30 only need to be formed in the mode in which the quartz crystal resonator 10 is fixed at both ends of the quartz crystal blank 11 in the long-side direction.

In the quartz crystal resonator unit 1 according to the present embodiment, an alternating electric field is applied via the outer electrodes 35a, 35b of the first board 30 between the first excitation electrode 14a and the second excitation electrode 14b that make up the quartz crystal resonator 10. Thus, the quartz crystal blank 11 vibrates in a predetermined vibration mode, such as a thickness shear vibration mode, and resonance characteristics resulting from the vibrations are obtained.

Next, a manufacturing method for an electronic component according to the present embodiment will be described with reference to FIG. 3 to FIG. 15. In the following description, the description of matters common to the above is omitted. Particularly, similar operation and advantageous effects with a similar configuration will not be described one by one. Description will be made by taking a ceramic board made of alumina as an example of both a substrate 131 and a transfer board 151. By cutting a transfer main surface of the transfer board that is the ceramic board, the transfer board having the transfer main surface whose surface roughness is small and whose flatness is small as a result of reduction of the shape of warpage caused by ceramic firing, or the like, is prepared. The substrate 131 and the transfer board 151 may be made of another material.

Figure 3:
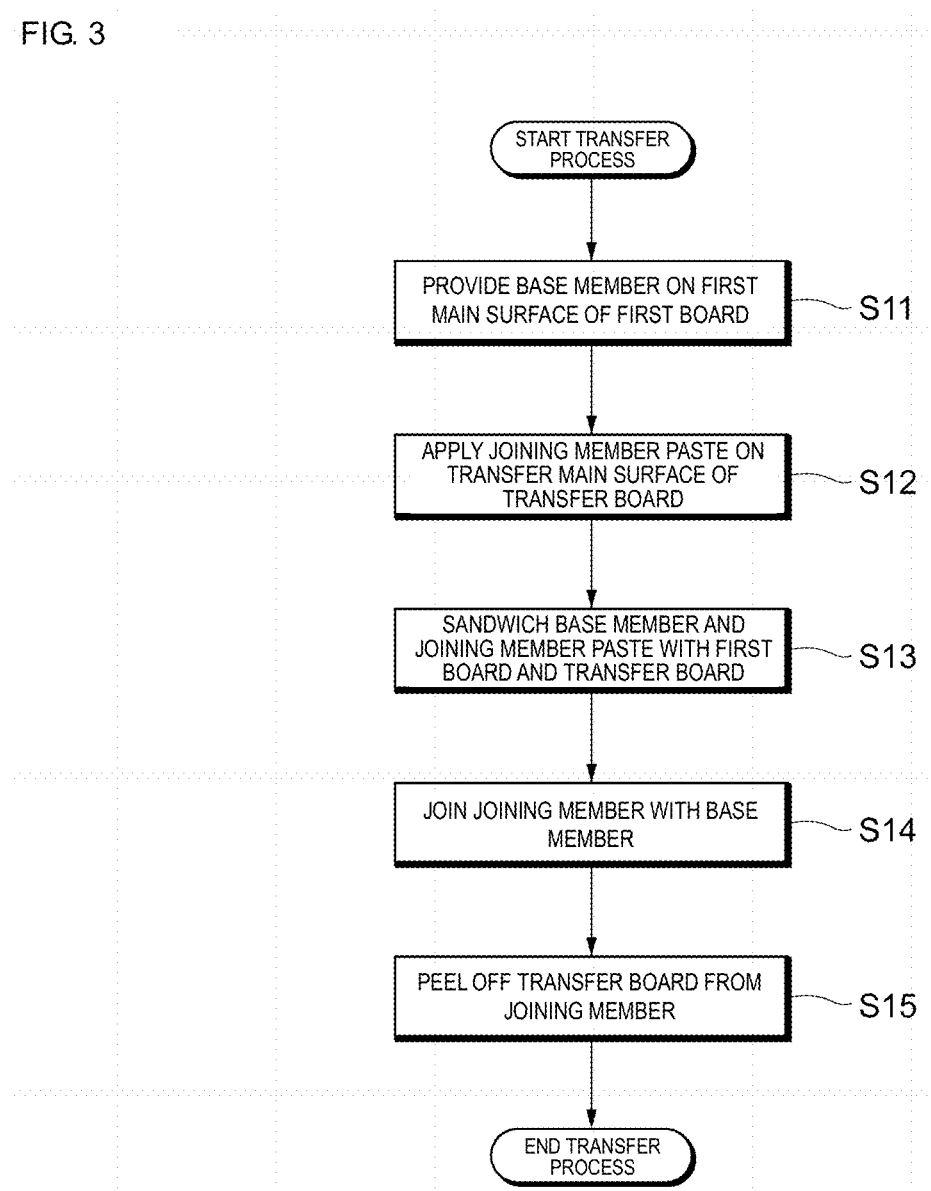
FIG. 3 is a flowchart that shows a transfer process in a manufacturing method for an electronic component according to the first embodiment of the present invention.
Figure 4:
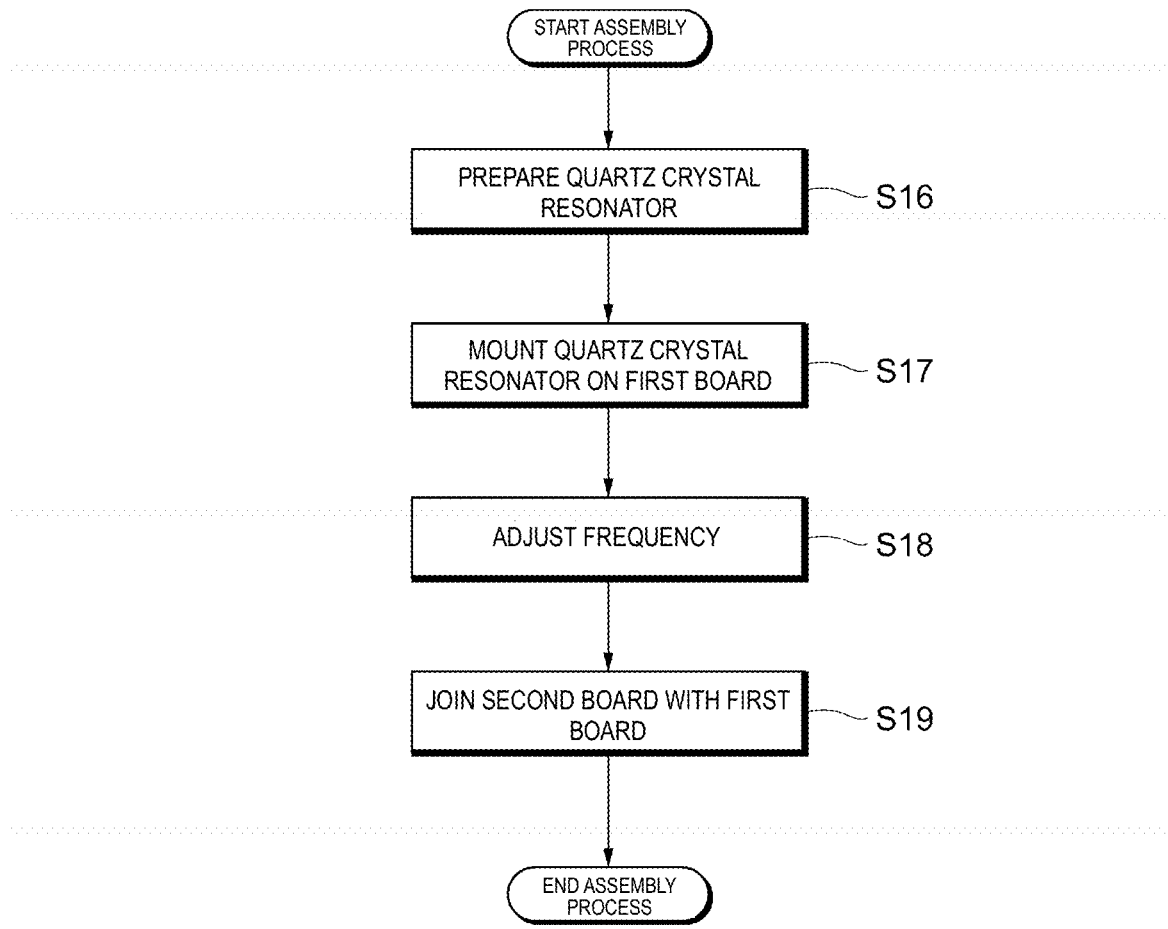
FIG. 4 is a flowchart that shows an assembly process in the manufacturing method for an electronic component according to the first embodiment of the present invention.
Figure 5:
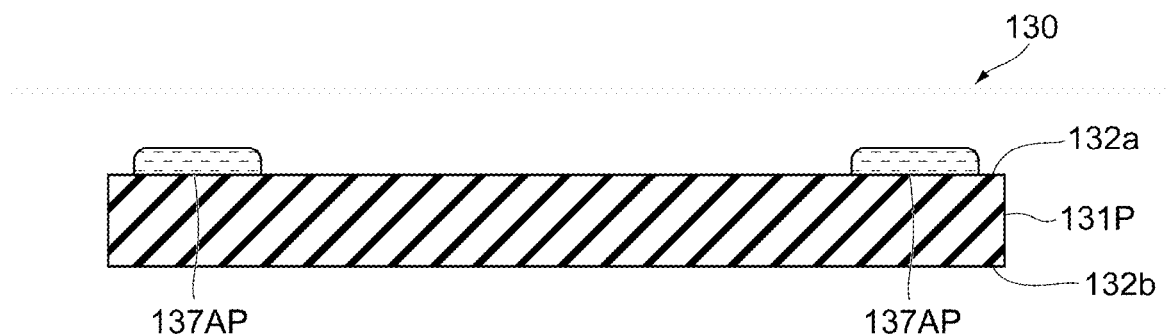
FIG. 5 is a cross-sectional view that schematically shows the configuration of close contact layer paste provided on a first main surface of a first board.
Figure 6:
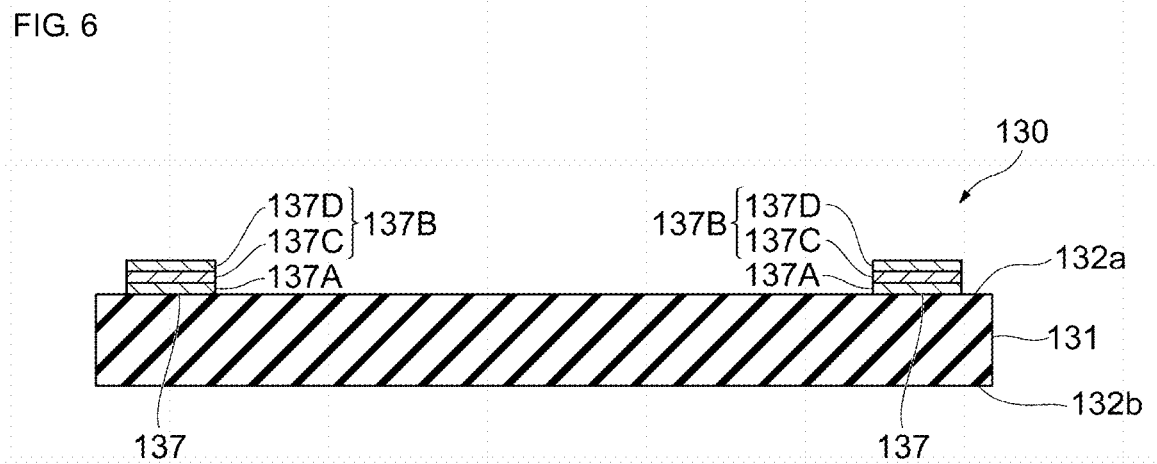
FIG. 6 is a cross-sectional view that schematically shows a process of providing a base member.
Figure 7:
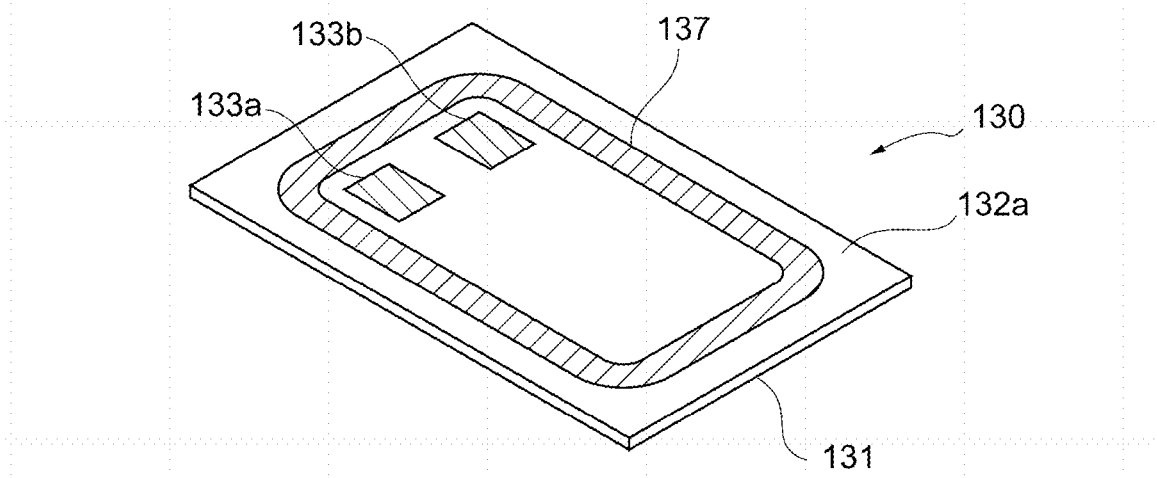
FIG. 7 is a perspective view that schematically shows the configuration of the first board that is subjected to the transfer process.
Figure 8:
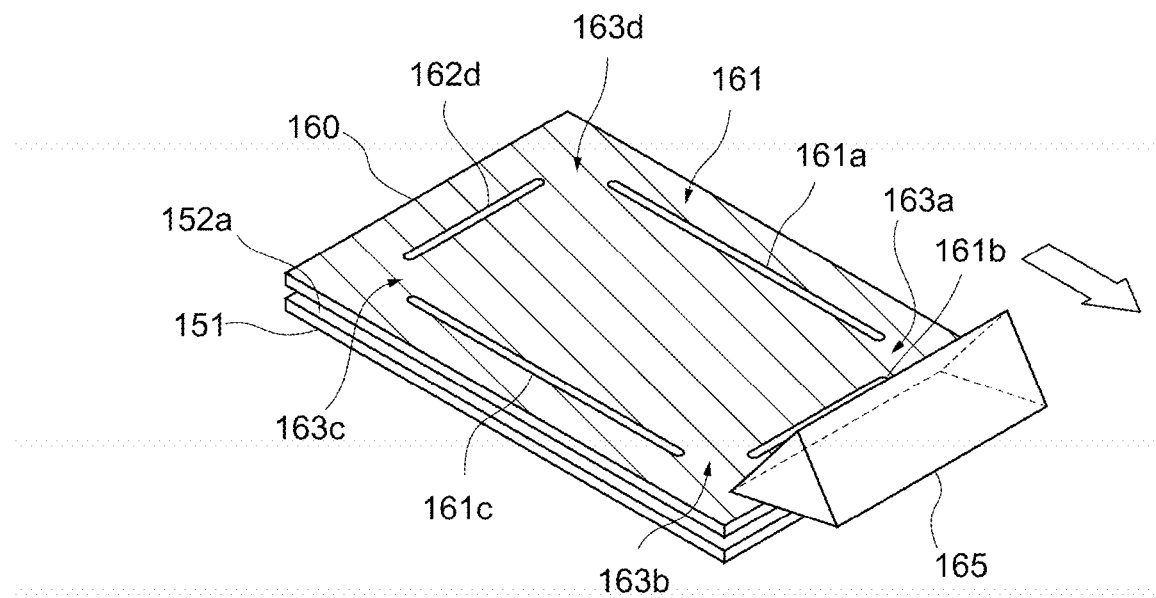
FIG. 8 is a perspective view that schematically shows a process of providing a joining member.
Figure 9:
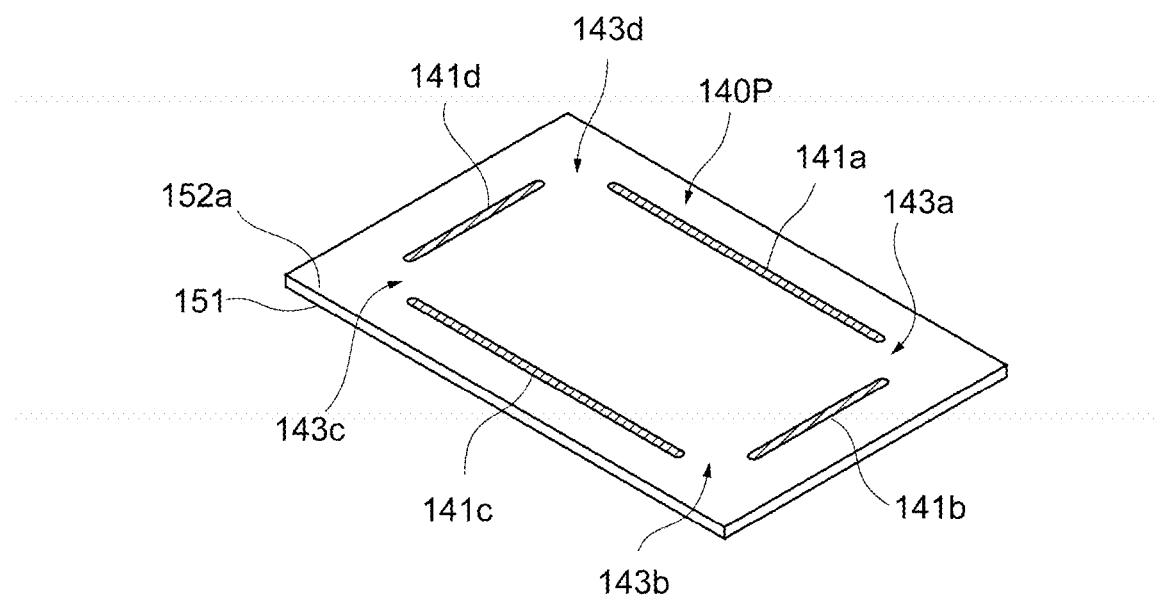
FIG. 9 is a perspective view that schematically shows joining member paste provided on a transfer main surface of a transfer board.
Figure 10:
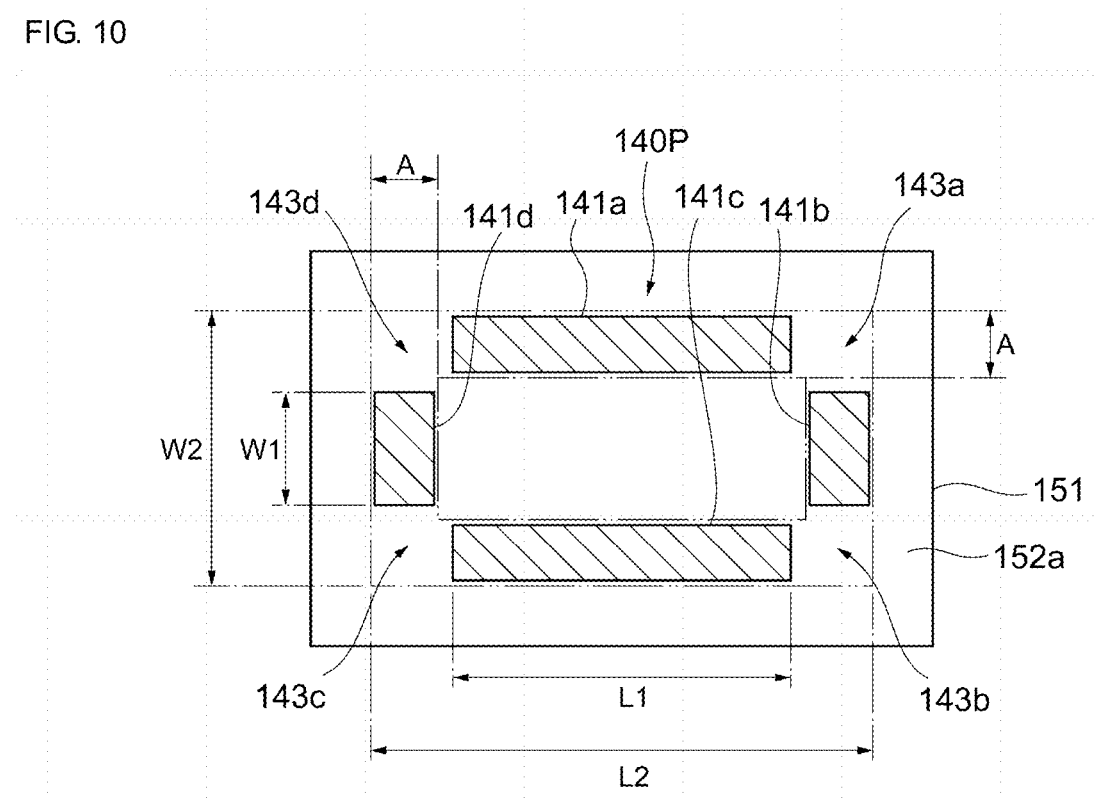
FIG. 10 is a plan view that schematically shows the configuration of the joining member paste shown in FIG. 9.
Figure 11:
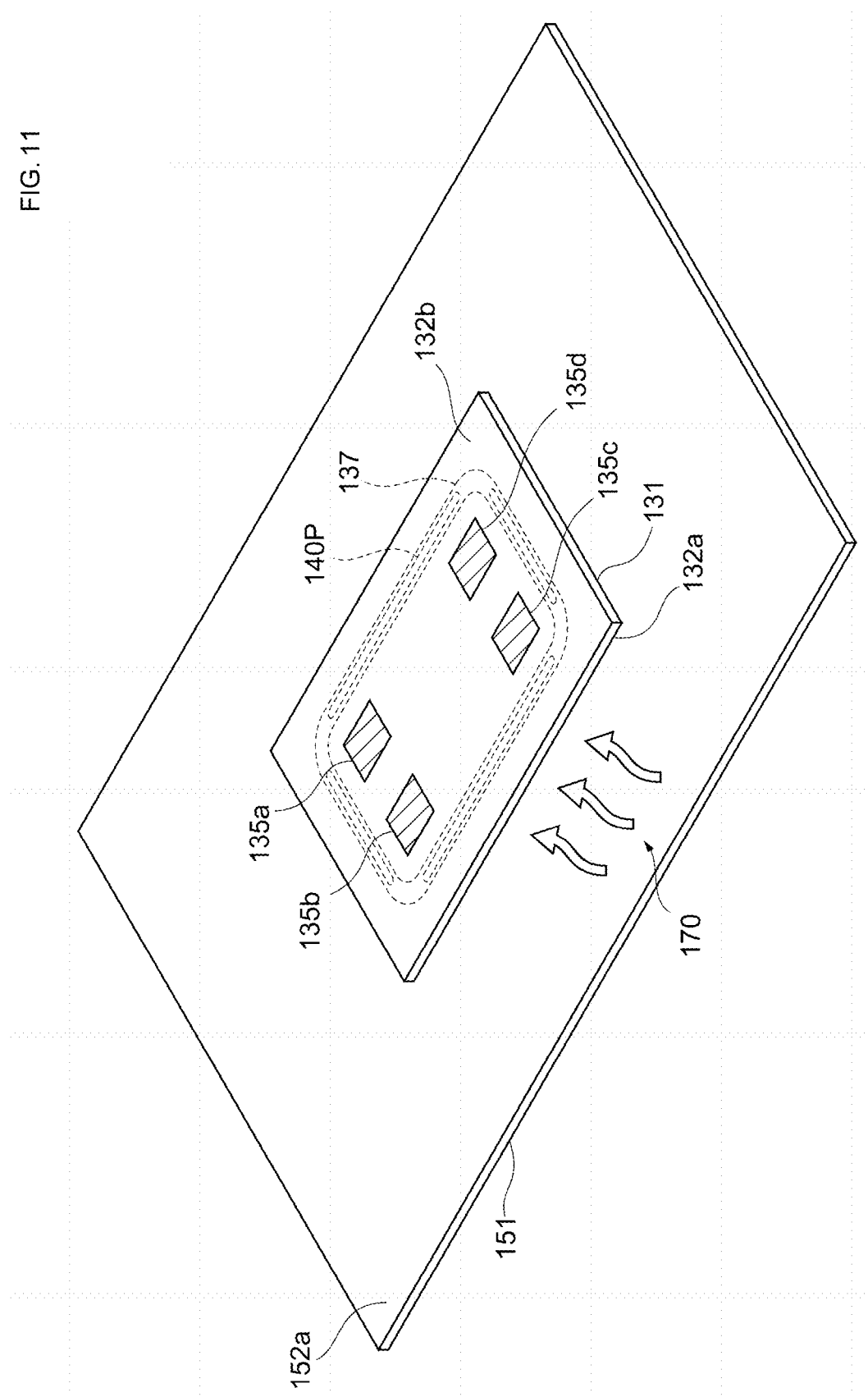
FIG. 11 is a perspective view that schematically shows a process of joining the joining member with the base member.
Figure 12:
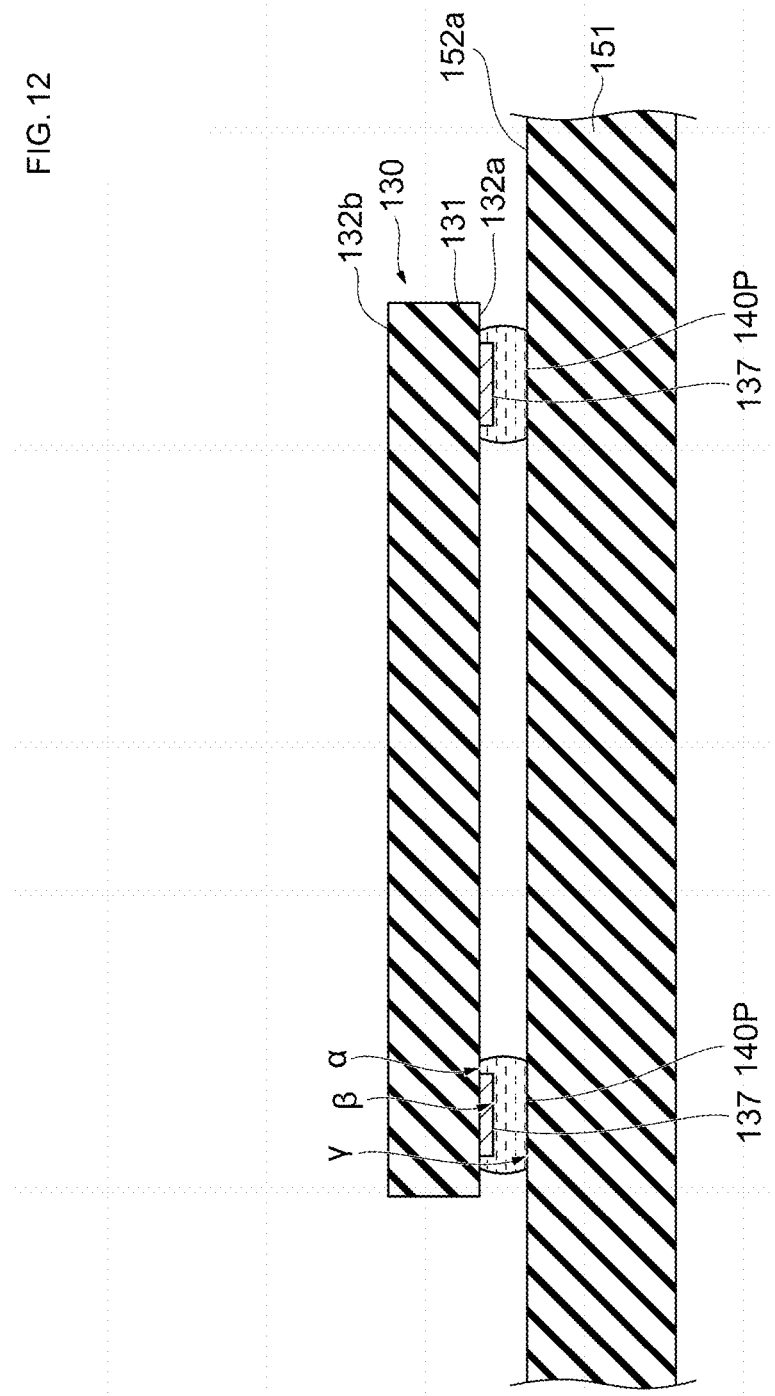
FIG. 12 is a cross-sectional view that schematically shows the configuration of the first board and transfer board that sandwich the base member and the joining member.
Figure 13:
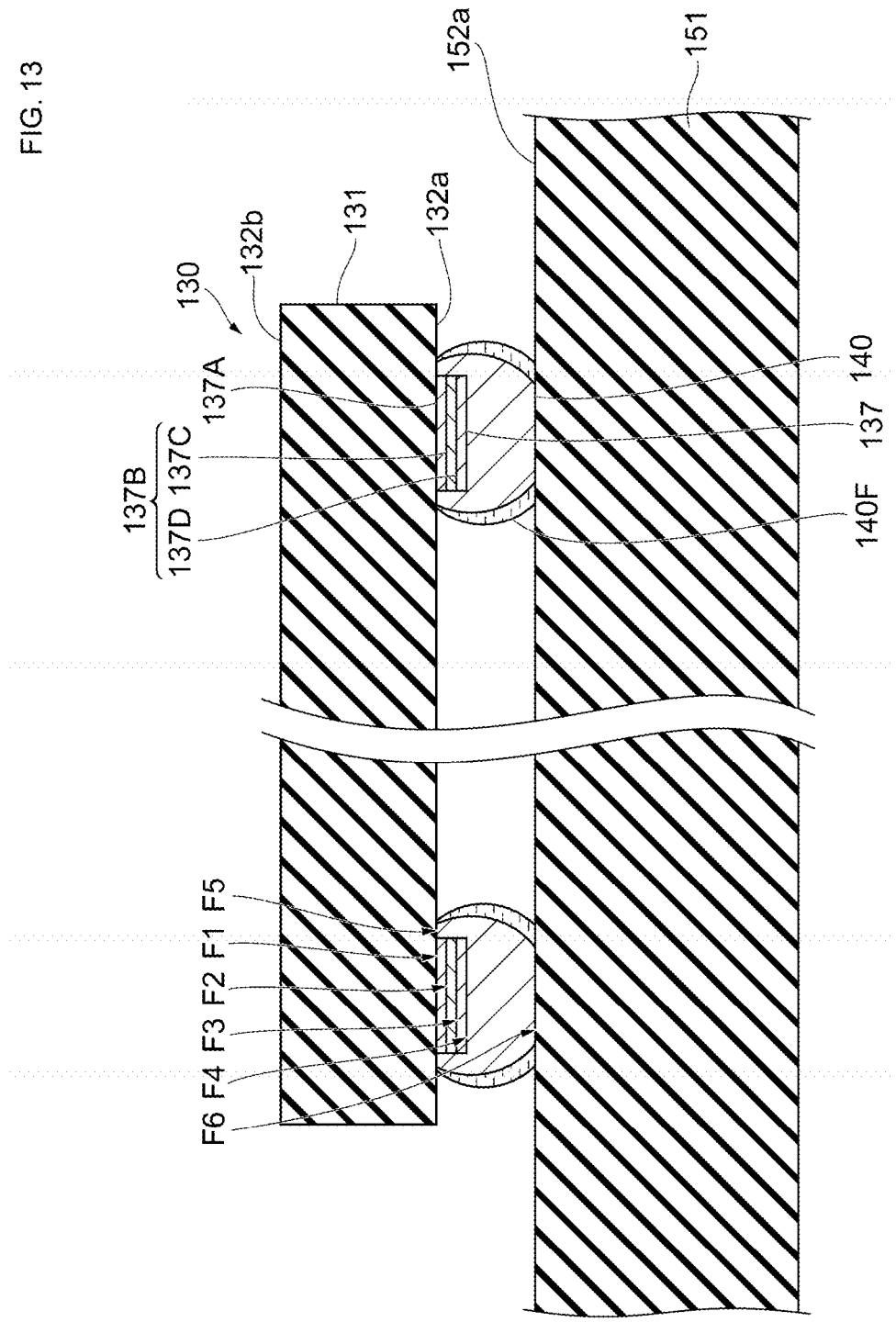
FIG. 13 is a cross-sectional view that schematically shows the configuration of the joining member solidified while the joining member is sandwiched by the first board and the transfer board.
Figure 14:
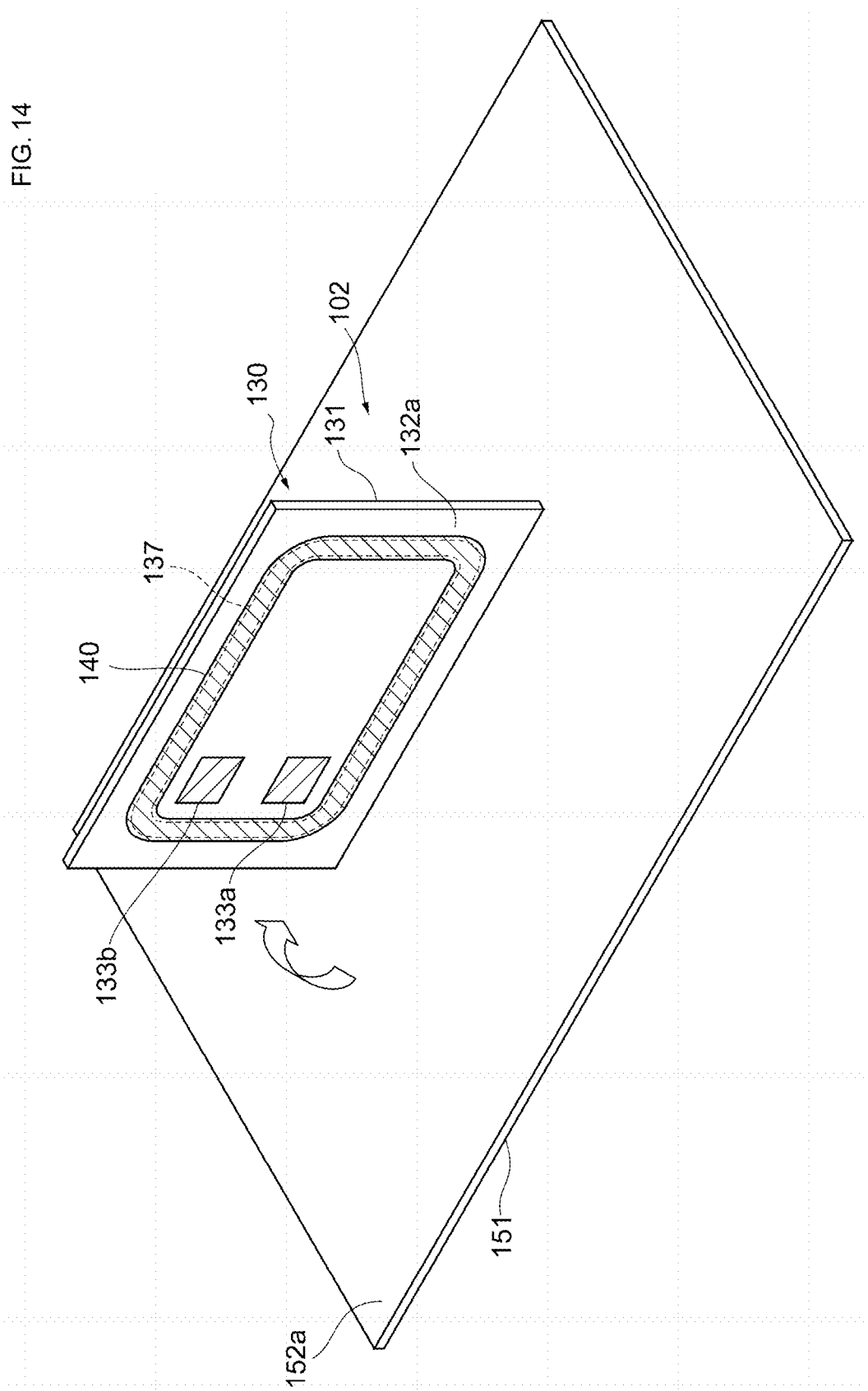
FIG. 14 is a perspective view that schematically shows a process of peeling off the joining member from the transfer board.
Figure 15:
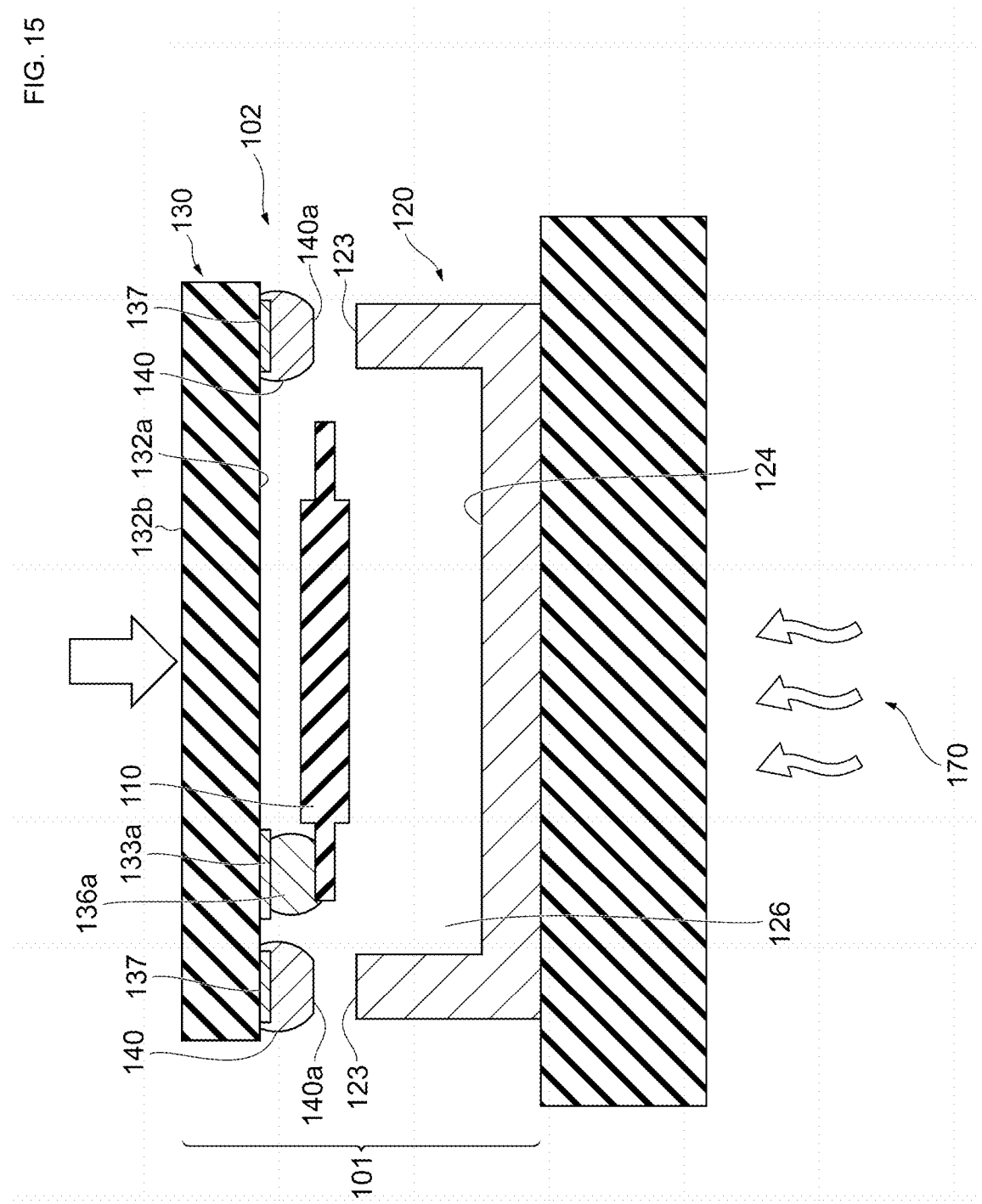
FIG. 15 is a cross-sectional view that schematically shows a process of joining a second board with the first board with the joining member interposed therebetween.

FIG. 3 is a flowchart that shows a transfer process in the manufacturing method for an electronic component according to the first embodiment of the present invention. FIG. 4 is a flowchart that shows an assembly process in the manufacturing method for an electronic component according to the first embodiment of the present invention. FIG. 5 is a cross-sectional view that schematically shows the configuration of close contact layer paste provided on the first main surface of the first board. FIG. 6 is a cross-sectional view that schematically shows a process of providing a base member. FIG. 7 is a perspective view that schematically shows the configuration of a first board that is subjected to the transfer process. FIG. 8 is a perspective view that schematically shows a process of providing a joining member. FIG. 9 is a perspective view that schematically shows joining member paste provided on a transfer main surface of a transfer board. FIG. 10 is a plan view that schematically shows the configuration of the joining member paste shown in FIG. 9. FIG. 11 is a perspective view that schematically shows a process of joining the joining member with the base member. FIG. 12 is a cross-sectional view that schematically shows the configuration of the first board and transfer board that sandwich the base member and the joining member. FIG. 13 is a cross-sectional view that schematically shows the configuration of the joining member solidified while the joining member is sandwiched by the first board and the transfer board. FIG. 14 is a perspective view that schematically shows a process of peeling off the joining member from the transfer board. FIG. 15 is a cross-sectional view that schematically shows a process of joining a second board with the first board with the joining member interposed therebetween.

First, the transfer process will be described. When the transfer process is started, a base member 137 is provided on a first main surface 132a of a first board 130 as shown in FIG. 7 (S11).

In this process, first, as shown in FIG. 5, a green sheet 131P is molded by using ceramic powder mainly made from alumina. Subsequently, via holes and via electrodes not shown in the drawings are provided in a substrate 131. After that, close contact layer paste 137AP is provided on a first main surface 132a of the green sheet 131P. The close contact layer paste 137AP is in a liquid form and contains a metal component (Mo) and a binder component. The close contact layer paste 137AP is provided by a printing method. Then, the green sheet 131P and the close contact layer paste 137AP both are fired at approximately 1600° C. in hydrogen atmosphere. As a result, the substrate 131 that is a ceramic board made of a sintered body is obtained from the green sheet 131P. At this time, the substrate 131 shrinks by, for example, 20% through sintering. This shrinkage at the time of sintering is a factor to develop warpage in a ceramic board that is a sintered body. A close contact layer 137A that is a sintered metal (Mo) obtained through sintering and that is joined with the ceramic board is obtained from the close contact layer paste 137AP. With this configuration, in comparison with the case where the close contact layer 137A is provided on the substrate 131 made of a sintered body by physical vapor deposition (PVD) or chemical vapor deposition (CVD), the substrate 131 and the close contact layer 137A are firmly in close contact with each other because of factors that a metal composition in the close contact layer paste 137AP enters porosities in the ceramic sintered body and is sintered. Therefore, the joining strength between the close contact layer 137A and the formation surface of the substrate 131 is increased.

Next, a first layer 137C and second layer 137D of a base layer 137B are sequentially formed on the close contact layer 137A by a plating method. According to the exemplary embodiment, the first layer 137C is an Ni layer, and the second layer 137D is an Au layer. In this manner, as shown in FIG. 6, the base member 137 including the close contact layer 137A and the base layer 137B is provided on the first main surface 132a of the substrate 131. As shown in FIG. 7, the base member 137 is provided in a closed frame shape so as to surround electrode pads 133a, 133b when viewed in plan in the direction of the normal to the first main surface 132a. That is, the base member 137 is formed continuously in a rectangular ring shape. When the effect of hermetic sealing is not needed, for example, when a circuit board and the first board are electrically connected with the joining member interposed therebetween and then mounted, the base member 137 may be formed in an open frame shape, that is, the base member 137 may be formed discontinuously.

Subsequently, joining member paste 140P is applied on a transfer main surface 152a of the transfer board 151 (S12). As shown in FIG. 8, the plate-shaped transfer board 151 formed by using ceramics (alumina) is prepared, and a metal mask 160 is positioned on the transfer main surface 152a. Then, the joining member paste 140P that is a brazing member for soldering is applied from above the metal mask 160 with a squeegee (spatula) 165, for example. The joining member paste 140P is in a liquid state, and contains a gold (Au)-tin (Sn) eutectic alloy and flux. The metal mask 160 has an opening portion 161 that coincides in shape with the base member 137. The joining member paste 140P is applied onto the transfer main surface 152a of the transfer board 151 through the opening portion 161. A plate-shaped transfer plate whose transfer main surface 152a is planar is used as an example of the transfer board 151. However, it is noted that the transfer board 151 is not limited thereto. The transfer main surface 152a may have a refractive surface or a curved surface.

When the joining member 140 contains metallic material, particularly, when the joining member 140 is only metallic material, it is desirable that the transfer main surface 152a of the transfer board 151 be made of a nonmetallic material. With this configuration, there is no metal joining, so the adhesion between the joining member 140 and the transfer main surface 152a is reduced. When the transfer board 151 is peeled off from the joining member 140 in a later peeling process, the effect of reducing the joining strength reduces residues of the joining member 140 on the transfer board 151. That is, damage to the joining member 140 is reduced. The transfer board 151 may be transparent glass. With this configuration, by taking a picture with a camera, a status, such as the shape of the joining member paste 140P, can be easily recognized through the transfer board 151. Therefore, by using the glass transfer board 151, the difference between an actual state of a top edge portion 140a of the joining member 140 and a desired shape and size can be easily recognized, so formation of the joining member 140 becomes easy. To reduce deformation, such as warpage, of the transfer board, it is desirable that the thickness of the transfer board be greater than or equal to ten times as large as the thickness of the first board, and it is more desirable that the thickness of the transfer board be greater than or equal to 100 times as large as the thickness of the first board.

As shown in FIG. 8, the opening portion 161 includes a first slit 161a, a third slit 161c, a second slit 161b, and a fourth slit 161d. The first slit 161a and the third slit 161c correspond to a pair of long sides of the base member 137. The second slit 161b and the fourth slit 161d correspond to a pair of short sides of the base member 137. The opening portion 161, different from the base member 137, has an open frame shape, and has bridge portions 163a, 163b, 163c, 163d such that a metal mask in a region surrounded by the opening portion 161 does not come off. The bridge portions 163a to 163d connect the inner side and outer side of the opening portion 161 when viewed in plan in the direction of the normal to the main surface of the metal mask 160. The bridge portions 163a to 163d are respectively located at the corners of the opening portion 161. The first slit 161a and the second slit 161b are isolated by the bridge portion 163a. The second slit 161b and the third slit 161c are isolated by the bridge portion 163b. The third slit 161c and the fourth slit 161d are isolated by the bridge portion 163c. The fourth slit 161d and the first slit 161a are isolated by the bridge portion 163d. The positions of the bridge portions are not limited to the above positions. For example, the bridge portions may be disposed away from the corners of the opening portion 161 such that each of the first slit 161a and the third slit 161c is made up of a plurality of discontinuous slits.

As shown in FIG. 9, the joining member paste 140P is provided on the transfer main surface 152a in a shape that meets the opening portion 161. That is, the joining member paste 140P has a shape such that the joining member paste 140P banks up on the base member 137, and is formed in a rectangular ring shape without corner portions when viewed in plan in the direction of the normal to the transfer main surface 152a of the transfer board 151. Specifically, the joining member paste 140P has a first portion 141a, a third portion 141c, a second portion 141b, and a fourth portion 141d. The first portion 141a and the third portion 141c correspond to a pair of long sides of the base member 137. The second portion 141b and the fourth portion 141d correspond to a pair of short sides of the base member 137. The joining member paste 140P is provided without corner portions 143a, 143b, 143c, 143d. The first portion 141a to the fourth portion 141d are separated from each other. The first portion 141a to the fourth portion 141d respectively correspond to the first slit 161a to the fourth slit 161d. The corner portions 143a to 143d respectively correspond to the bridge portions 163a to 163d. Since the joining member paste 140P is applied except at the corner portions where the joining member paste 140P tends to concentrate, liquid stagnation that occurs when a metal component melted by heating into a liquid phase in the joining member paste 140P gets wet and spreads and then concentrates at the corner portions of the base member 137 is reduced. That is, outer shape defects of the joining member are reduced.

The process S12 described above is so-called screen printing. It should be appreciated that the method of forming the joining member 140 is not limited thereto. For example, the joining member 140 may be provided by a known formation process, such as a needle discharge method.

An example of the dimensions of the joining member paste 140P formed through the process S12 will be described with reference to FIG. 10. Assuming that the width of the joining member paste 140P in a short-side direction uniformly A and the thickness of the joining member paste 140P along the direction of the normal to the transfer main surface 152a is uniformly T. Assuming that the length of each of the first portion 141a and the third portion 141c in a long-side direction is L1 and the length of the sum of each portion and the associated corner portions is L2. Assuming that the length of each of the second portion 141b and the fourth portion 141d in a long-side direction is W1 and the length of the sum of each portion and the associated corner portions is W2. At this time, the volume V1 of the joining member paste 140P is expressed by the following equation (1).

$$V1 = 2 \times T \times A \times (L1 + W1) \qquad (1)$$

The volume on the assumption that the joining member is also formed at the corner portions 143a to 143d, that is, the volume V2 of the joining member paste 140P when the joining member paste 140P is formed in a closed frame shape, is expressed by the following equation (2).

$$V2 = 2 \times T \times A \times (W2 - 2 \times A) + 2 \times T \times A \times L2 = \qquad (2)$$
$$2 \times T \times A \times (W2 + L2 - 2 \times A)$$

To cause the joining member paste 140P to soften and change into a closed frame shape in a later process, it is desirable that the volume V1 be, for example, greater than or equal to 80% of the volume V2. To avoid formation of liquid stagnation at the corner portions 143a to 143d at the time when the joining member paste 140P softens in a later process, it is desirable that the volume V1 be less than or equal to 95% of the volume V2. That is, it is desirable that $0.80 \leq V1/V2 \leq 0.95$ be satisfied. When the equation (1) and the equation (2) are substituted into the above inequality and rearranged, the following inequality is derived.

$$0.80 \leq (L1 + W1)/(W + L - 2 \times A) \leq 0.95$$

To ensure joining force and reduce liquid stagnation, the following range is more desirable.

$$0.86 \leq (L1 + W1)/(W + L - 2 \times A) \leq 0.92$$

Subsequently, the base member 137 and the joining member 140 are sandwiched by the first board 130 and the transfer board 151 (S13). As shown in FIG. 11 and FIG. 12, the first main surface 132a of the first board 130 and the transfer main surface 152a of the transfer board 151 sandwich the base member 137 and the joining member paste 140P. Specifically, the joining member paste 140P is disposed on the first main surface 132a of the first board 130 so as to coincide with the disposition pattern of the base member 137 when the first main surface 132a of the first board 130 is viewed in plan in a state where the first board 130 and the transfer board 151 are put one above the other. The base member 137 and the joining member paste 140P are put one above the other. Since the joining member paste 140P has an adequate viscosity, the transfer board 151 and the first board 130 are stuck to each other by the joining member paste 140P. Then, the first board 130 placed on the transfer board 151 is heated in a furnace raised in temperature, with the result that the joining member paste 140P softens. In joining the base member 137 with the joining member 140, it is desirable that the viscosity of the joining member paste 140P be determined such that the first board 130 does not come off from the transfer board 151 under the wind pressure of hot air 170 in the furnace or a disturbance, such as vibrations of manufacturing equipment.

Moreover, in the exemplary embodiment, the wettability β of the joining member paste 140P against the base member 137 is higher than the wettability α of the joining member paste 140P against the first main surface 132a of the first board 130. With this configuration, the joining member paste 140P gets wet to spread along the base member 137 on the first board 130 side, and the shape changes into a closed frame shape (rectangular ring shape). The joining member paste 140P can reduce wet spreading on the first main surface 132a, and can reduce shape defects of the joining member 140. The wettability β of the joining member paste 140P against the base member 137 is higher than the wettability γ of the joining member paste 140P against the transfer main surface 152a of the transfer board 151. With this configuration, the joining member paste 140P can reduce wet-spreading on the first board 130 side, and can reduce shape defects of the joining member 140.

After that, the joining member 140 is joined with the base member 137 (S14). The joining member paste 140P is solidified while the joining member paste 140P is sandwiched by the first board 130 and the transfer board 151. Thus, the joining member 140 joined with the base member 137 is formed. The joining member paste 140P is heated to soften, and then cooled to solidify. At this time, as shown in FIG. 13, flux 140F covers the joining member 140. In the softening and solidification process of the joining member paste 140P sandwiched by the first board 130 and the transfer board 151, the flux 140F lies outside molten metal in the joining member paste 140P. Thus, the flux 140F serves as antisagging agent to reduce unnecessary wet-spreading of the joining member paste 140P to the transfer board 151, with the result that the shape of the joining member 140 is stabilized. The flux 140F solidifies so as to connect the first board 130 side and the transfer board 151 side, thus assisting in joining of the first board 130 with the transfer board 151.

The joining member 140 is made of the metal component of the joining member paste 140P. In process in which the joining member 140 is formed, the base member 137 and the joining member 140 form metal joining. That is, an alloy is formed at the boundary between the base member 137 and the joining member 140. With this configuration, the joining strength between the base member 137 and the joining member 140 is improved.

The joining strength F6 of the transfer board 151 with the joining member 140 is the least among joining strengths between the first board 130 and the transfer board 151. That is, the joining strength F6 is less than the joining strength F1 between the close contact layer 137A and the first board 130, less than the joining strength F2 between the first layer 137C of the base layer 137B and the close contact layer 137A, less than the joining strength F3 between the first layer 137C and second layer 137D of the base layer 137B, less than the joining strength F4 between the second layer 137D of the base layer 137B and the joining member 140, and less than the joining strength F5 between the joining member 140 and the first board 130. With this configuration, in a later process of peeling off the transfer board 151 from the joining member 140, damage to the joining member 140 is reduced based on the joining strength F6 relative to the other joining strengths.

Subsequently, the transfer board 151 is peeled off from the joining member 140 (S15). As shown in FIG. 14, the joining member 140 joined with the base member 137 is peeled off from the transfer board 151, and the transfer board 151 is pulled apart from the first board 130. Thus, a second electronic component 102 including the first board 130 and the joining member 140 is complete. At this time, the shape of the transfer main surface 152a of the transfer board 151 is transferred to the top edge portion 140a of the joining member 140. As shown in FIG. 15, the top edge portion 140a has a planar shape. After that, the flux 140F is removed by cleaning the first board 130, on which the joining member 140 is formed, with a solvent that can remove the solidified flux 140F. By removing the flux 140F, alteration due to pollution, damage, or chemical reaction of other members caused by the volatilized flux 140F is reduced. The transfer board may be peeled off from the joining member 140 after the flux 140F is removed or while the flux 140F is being removed. With this configuration, the joining force or adhesion of the flux 140F disappears, so the peeling process becomes easy.

Preferably, the transfer main surface 152a of the transfer board 151 be lower in surface roughness than the first main surface 132a of the first board 130. With this configuration, the joining strength between the joining member 140 and the transfer board 151 is reduced, and also residues of the joining member 140 on the transfer board 151 side in process S15 are reduced.

According to the exemplary embodiment, the transfer board 151 is thicker and higher in stiffness than the first board 130. That is, the transfer board 151 is less prone to make a deformation, such as warpage, than the first board 130. The flatness of the first main surface 132a of the first board 130 less influences on the shape of the top edge portion 140a of the joining member 140, and the flatness of the transfer main surface 152a of the transfer board 151 more influences on the shape of the top edge portion 140a of the joining member 140. Therefore, the transfer main surface 152a of the transfer board 151 is less in flatness than the first main surface 132a of the first board 130. In process S12, it is desirable that at least the region on the transfer main surface 152a of the transfer board 151, facing the first main surface 132a of the first board 130 via the joining member paste 140P, be less in flatness than the first main surface 132a of the first board 130. With this configuration, the top edge portion 140a of the joining member 140 is formed in a planar shape. Therefore, when the joining member 140 is joined with a planar portion of the second board 120 in a later process, the top edge portion 140a of the joining member 140 can improve the joining strength. Particularly, even when a deformation, such as warpage, becomes large under, for example, the influence of a reduced thickness or multilayering of the first board 130, the top edge portion 140a having a high flatness is formed. Therefore, the joining member 140 improves the joining strength between the first board 130 and the second board 120. In the existing art, when a brazing material is formed to be thick to improve the adhesiveness between a ceramic board and a cover, a brazing member softened through heating can get wet to spread by its own weight to an unnecessary region. At this time, since a wiring layer and joining layer of a ceramic board is close in, for example, a miniaturized quartz crystal resonator unit, the wiring layer and the joining layer are short-circuited to become a defective. Even when the strength of the first board 130 decreases with a reduction in the thickness of the first board 130, the joining member 140 is disposed along the shape of the transfer main surface 152a of the transfer board 151 in a molten liquid state, cooled while the joining member 140 keeps its shape, and becomes a solid state to solidify, so processing stress that acts on the first board 130 is reduced. In an exemplary aspect, it is noted that the flatness of the present invention complies with the definition of the flatness tolerance of JIS B 0021 (1984).

Subsequently, a quartz crystal resonator 110 is mounted on the first board 130 (S17). The quartz crystal resonator 110 is a quartz crystal resonator having a substantially rectangular shape when the first main surface 132a of the first board 130 is viewed in plan. The quartz crystal resonator 110 is mounted in the region surrounded by the joining member 140 when the first main surface 132a of the first board 130 is viewed in plan. The quartz crystal resonator 110 is electrically connected to an electrode pad 133a through an electrically conductive holding member 136a. The electrically conductive holding member 136a is provided by using electrically conductive adhesive. Instead, the electrically conductive holding member 136a may be provided by using the same material as the joining member 140. In this case, the electrode pad 133a is provided together with the base member 137, and the electrically conductive holding member 136a is provided together with the joining member 140. That is, a sealing frame and a connection terminal spaced apart from the sealing frame may be provided by using the joining member 140 at the same time.

After that, the frequency is adjusted (S18). According to an exemplary aspect, the thickness of the quartz crystal resonator 110 is reduced by etching the quartz crystal resonator 110 such that the resonant frequency of the quartz crystal resonator 110 is set to a desired value. Thus, variations in characteristics among individuals of the quartz crystal resonators 110 are reduced, so yield is improved.

Subsequently, the second board 120 is joined with the first board 130 (S19). Thus, a first electronic component 101 including the second electronic component 102 and the second board 120 is complete. As shown in FIG. 15, the first board 130 is joined with the second board 120 with the base member 137 and the joining member 140 interposed therebetween. First, the second board 120 is stood on a stage. After that, the first board 130 is heated while being pressed by a pressing pin toward the second board 120 such that the top edge portion 140a of the joining member 140 is bought into contact with the facing surface 123 of the second board 120. At this time, an internal space 126 surrounded by the base member 137 and the joining member 140 is formed between the first board 130 and the second board 120. The internal space 126 is surrounded by the first main surface 132a of the first board 130 and an inner surface 124 of the second board 120, and the quartz crystal resonator 110 is hermetically encapsulated. Preferably, the hermetically sealed space has an atmosphere of a pressure lower than that of air, and it is more desirable that the hermetically sealed space have a vacuum atmosphere.

Next, modifications of the first exemplary embodiment will be described. In the following description, the description of matters common to those described above is omitted. It should be appreciated that in the following first and second modifications as well, similar advantageous effects to those described above are obtained.

<First Modification>

Figure 16:
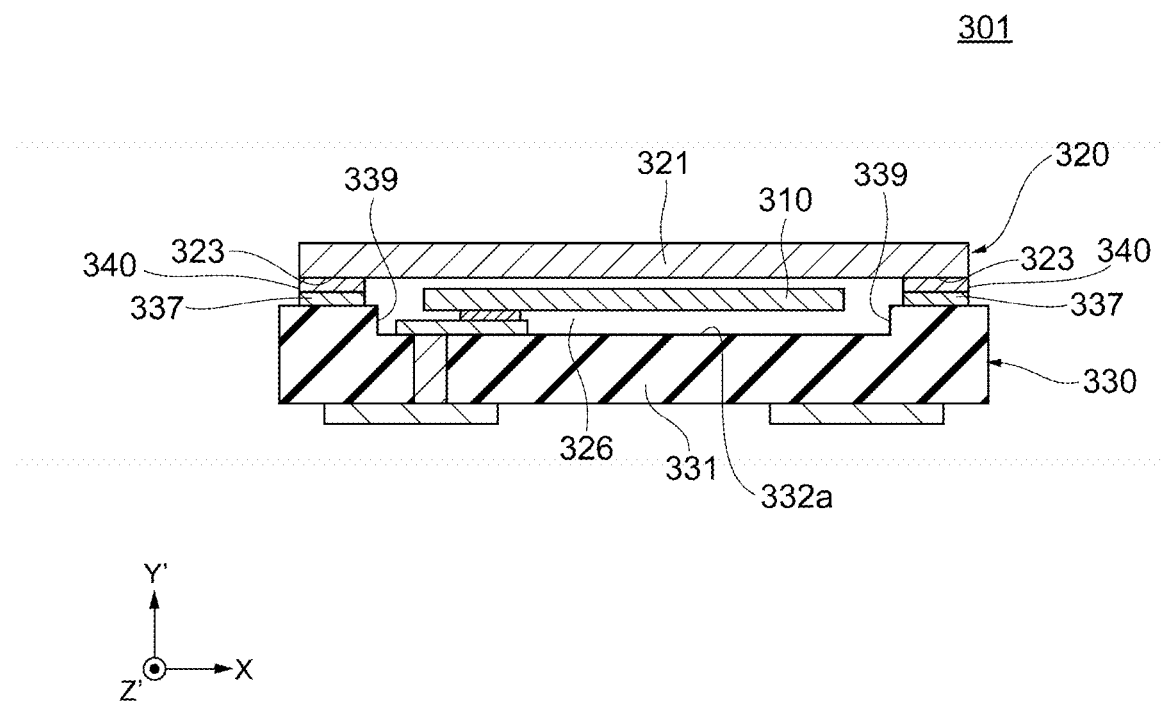
FIG. 16 is a cross-sectional view that schematically shows the configuration of a quartz crystal resonator unit according to a first modification.

The configuration of a quartz crystal resonator unit 301 according to the first modification of the first embodiment will be described with reference to FIG. 16. FIG. 16 is a cross-sectional view that schematically shows the configuration of the quartz crystal resonator unit according to the first modification. The first modification differs from the configuration example shown in FIG. 2 in that a second board 320 has a plate shape and a first board 330 has a recessed shape. It should be appreciated that the first board 330 and the second board 320 are joined with each other with a base member 337 and a joining member 340 interposed therebetween and form an internal space 326 that accommodates a quartz crystal resonator 310 in a similar configuration as the example shown in FIG. 2.

In the first modification, a substrate 331 has a step 339 on a first main surface 332a. When the substrate 331 is viewed in the plan view in the direction normal to the first main surface 332a, a center portion has a recessed shape, and a peripheral portion outside the center portion projects toward the second board 320. The quartz crystal resonator 310 is surrounded by the step 339 when viewed in the plan view in the direction normal to the first main surface 332a. The second board 320 has a plate shape and no side wall portion. The second board 320 has a facing surface 323 on a side of a top portion 321, facing the first board 330.

<Second Modification>

Figure 17:
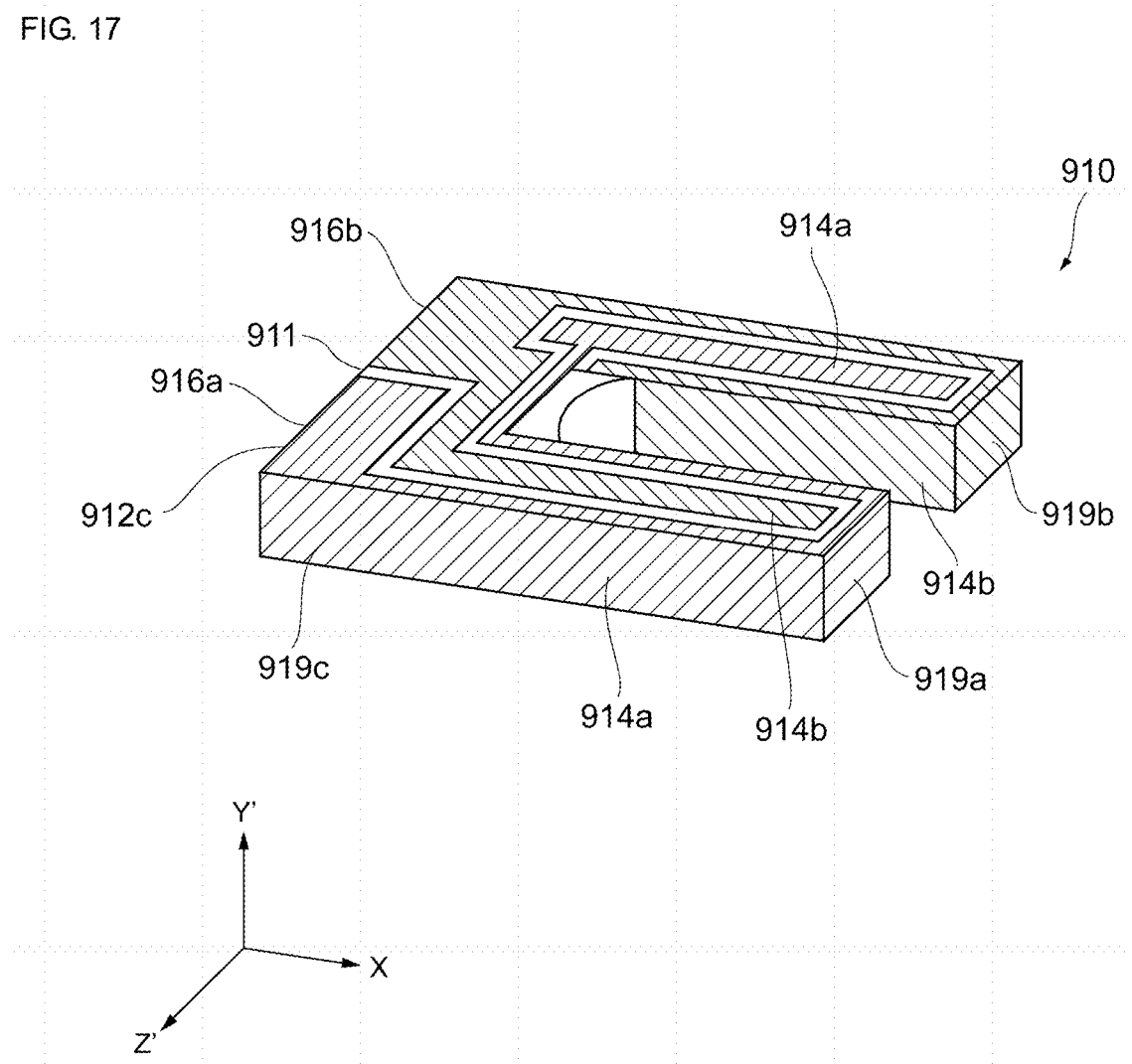
FIG. 17 is a perspective view that schematically shows the configuration of a quartz crystal resonator according to a second modification.

The configuration of a quartz crystal resonator 910 according to the second modification of the present embodiment will be described with reference to FIG. 17. FIG. 17 is a perspective view that schematically shows the configuration of the quartz crystal resonator according to the second modification.

The quartz crystal resonator 910 in the second modification differs from the quartz crystal resonator 10 shown in FIG. 1 in that a quartz crystal blank 911 has a tuning fork shape. That is, a quartz crystal resonator unit according to the second modification is a tuning fork-type quartz crystal resonator unit. The quartz crystal blank 911 specifically has two vibration arm portions 919a, 919b disposed parallel to each other. The vibration arm portions 919a, 919b extend in the X-axis direction, align in the Z'-axis direction, and are coupled to each other by a proximal portion 919c on an end surface 912c side. In other words, the plurality of vibration arm portions 919a, 919b extends from the proximal portion 919c. In the vibration arm portion 919a, an excitation electrode 914a is provided on each of a pair of main surfaces parallel to an XZ' plane and facing each other, and an excitation electrode 914b is provided on each of a pair of side end surfaces intersecting with the pair of main surfaces and facing each other. In the vibration arm portion 919b, the excitation electrode 914b is provided on each of a pair of main surfaces, and the excitation electrode 914a is provided on each of a pair of side end surfaces.

As described above, according to the second modification, the piezoelectric resonator 910 is a tuning fork-type quartz crystal resonator having the plurality of vibration arm portions 919a, 919b. The configuration of the piezoelectric resonator 910 is not specifically limited. The shape or number of the vibration arm portions, the disposition of the excitation electrodes, or the like, may be varied.

Second Embodiment

Figure 18:
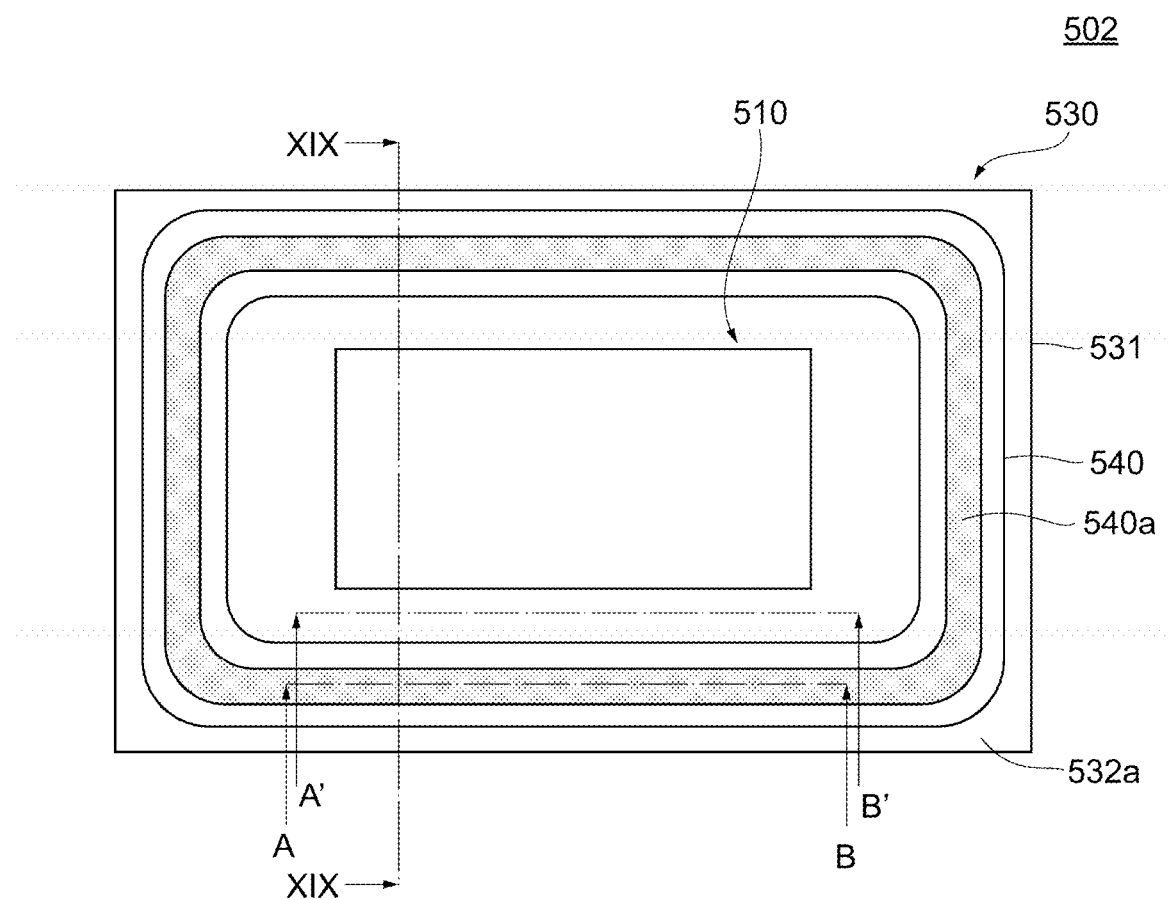
FIG. 18 is a plan view that schematically shows the configuration of an electronic component according to a second embodiment.
Figure 19:
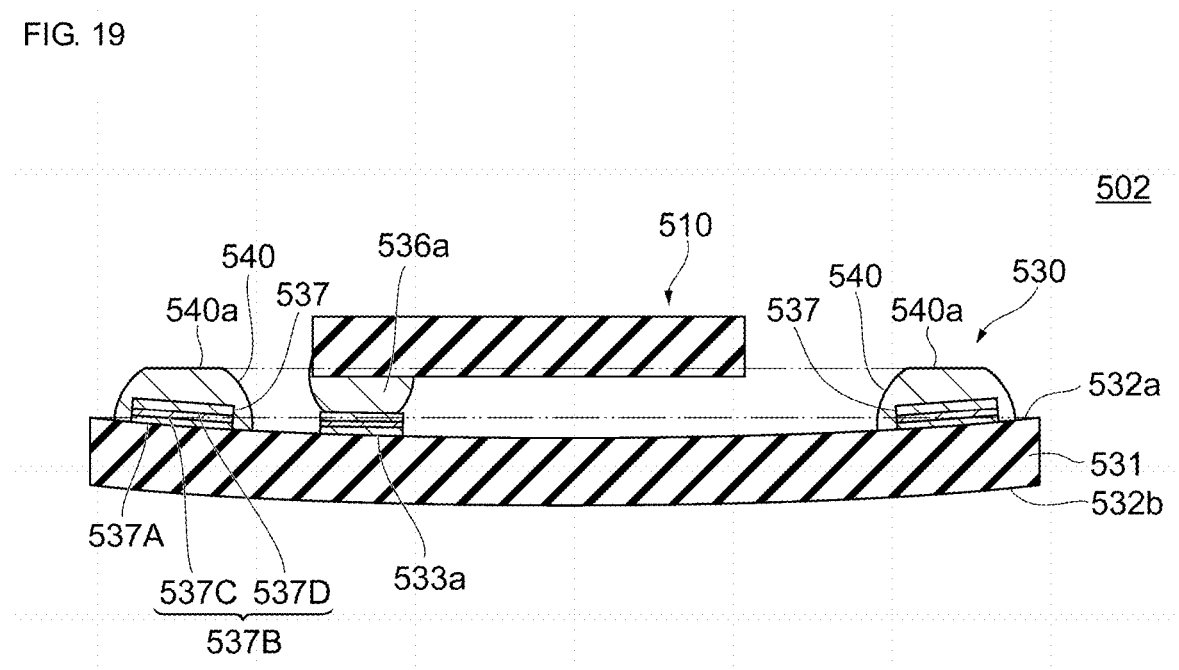
FIG. 19 is a cross section view that schematically shows the configuration of a cross section, taken along the line XIX-XIX, of the electronic component shown in FIG. 18.

The configuration of an electronic component 502 according to a second embodiment will be described with reference to FIG. 18 and FIG. 19. FIG. 18 is a plan view that schematically shows the configuration of the electronic component according to the second embodiment. FIG. 19 is a cross section view that schematically shows the configuration of a cross section, taken along the line XIX-XIX, of the electronic component shown in FIG. 18. The electronic component 502 corresponds to a first board 130-side component before being joined in process S19 of the first embodiment. The electronic component 502 is formed with the manufacturing method described in the first embodiment. Therefore, like reference numerals denote elements similar to those described above, and the description of elements common to those described above is omitted. The description of advantageous effects similar to those described above is also omitted.

The electronic component 502 includes a first board 530, a quartz crystal resonator 510, a base member 537, and a joining member 540.

The first board 530 includes a substrate 531 having a first main surface 532a and a second main surface 532b facing each other. The first board 530 is a ceramic board made of a sintered body. The substrate 531 has a bow shape such that the center portion of the first main surface 532a has a recessed shape and the cross section is convex toward a side opposite to the first main surface.

The quartz crystal resonator 510 is provided on the first main surface 532a side of the first board 530. The quartz crystal resonator 510 is mounted on the first board 530 by an electrode pad 533a and an electrically conductive holding member 536a, and is electrically connected to the first board 530.

The base member 537 is provided between the first main surface 532a of the first board 530 and the joining member 540. The base member 537 includes a close contact layer 537A and a base layer 537B. The close contact layer 537A is joined with the first main surface 532a of the first board 530. The close contact layer 537A is in contact with the substrate 531 that is a ceramic board. The close contact layer 537A is a sintered metal, and is fired with the substrate 531 that is a sintered body. The base layer 537B includes a first layer 537C and a second layer 537D. The first layer 537C is joined with the close contact layer 537A. The second layer 537D is joined with the first layer 537C.

The joining member 540 covers the base member 537. The material of the joining member 540 is only metal. The joining member 540 forms an alloy with the base member 537. The joining strength of the joining member 540 with the base member 537 is greater than the joining strength of the joining member 540 with the first board 530. The joining member 540 is provided in a frame shape surrounding the quartz crystal resonator 510 when the first main surface 532a of the first board 530 is viewed in plan.

The joining member 540 has a top edge portion 540a to be joined with a second board. The top edge portion 540a of the joining member 540 is provided in a plane. With this configuration, even when the shape of a joining surface of the second board is a planar shape or another shape different from the shape of the first main surface 532a of the first board 530, the joining member 540 can firmly join the first board 530 with the second board. The top edge portion 540a of the joining member 540 is exposed and has a planar shape. With this configuration, the joining member 540 can firmly join the first board 530 with the second board.

Next, the performance evaluation of the joining member 540 will be described. Example has a configuration using the manufacturing method for an electronic component of the first embodiment. Comparative Example has a configuration in which joining member paste is applied on a base member and then the joining member paste is directly solidified. The other manufacturing conditions of Example and Comparative Example are similar.

(Planar Shape Evaluation)

Figure 20:
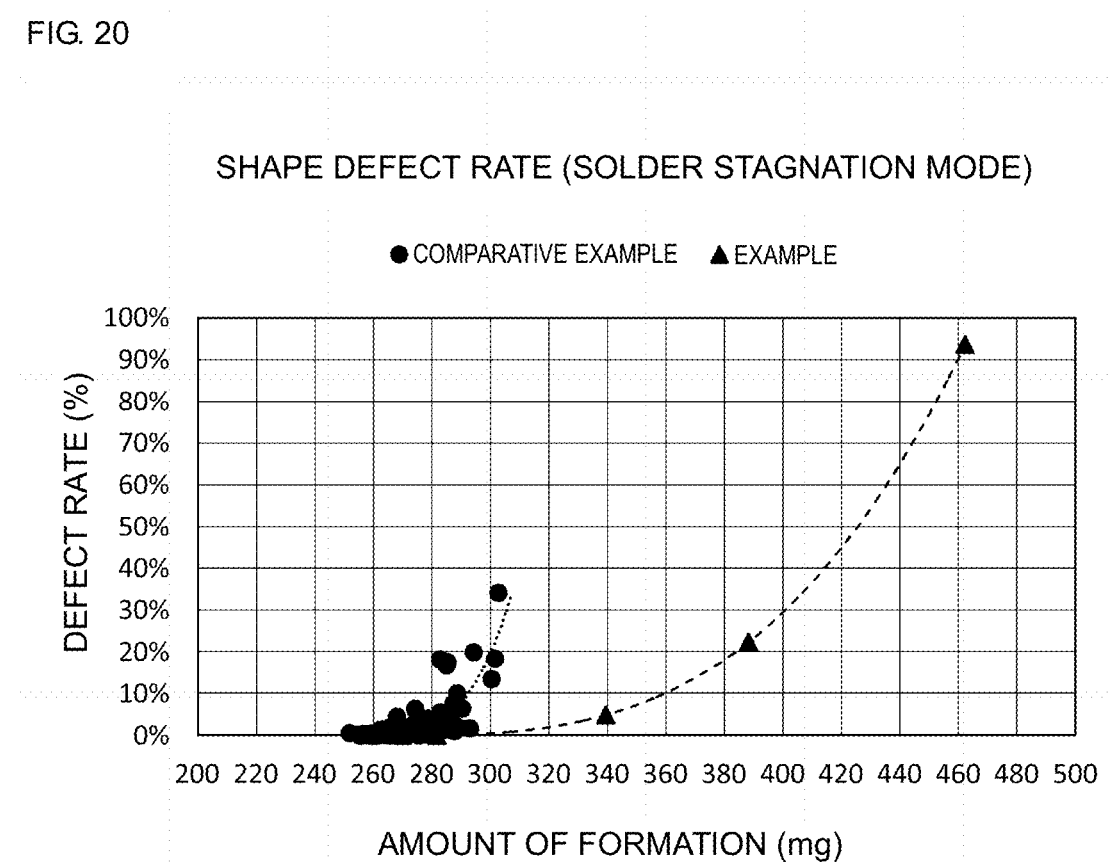
FIG. 20 is a graph that shows the shape defect rates of joining members due to an excess of joining member paste.
Figure 21:
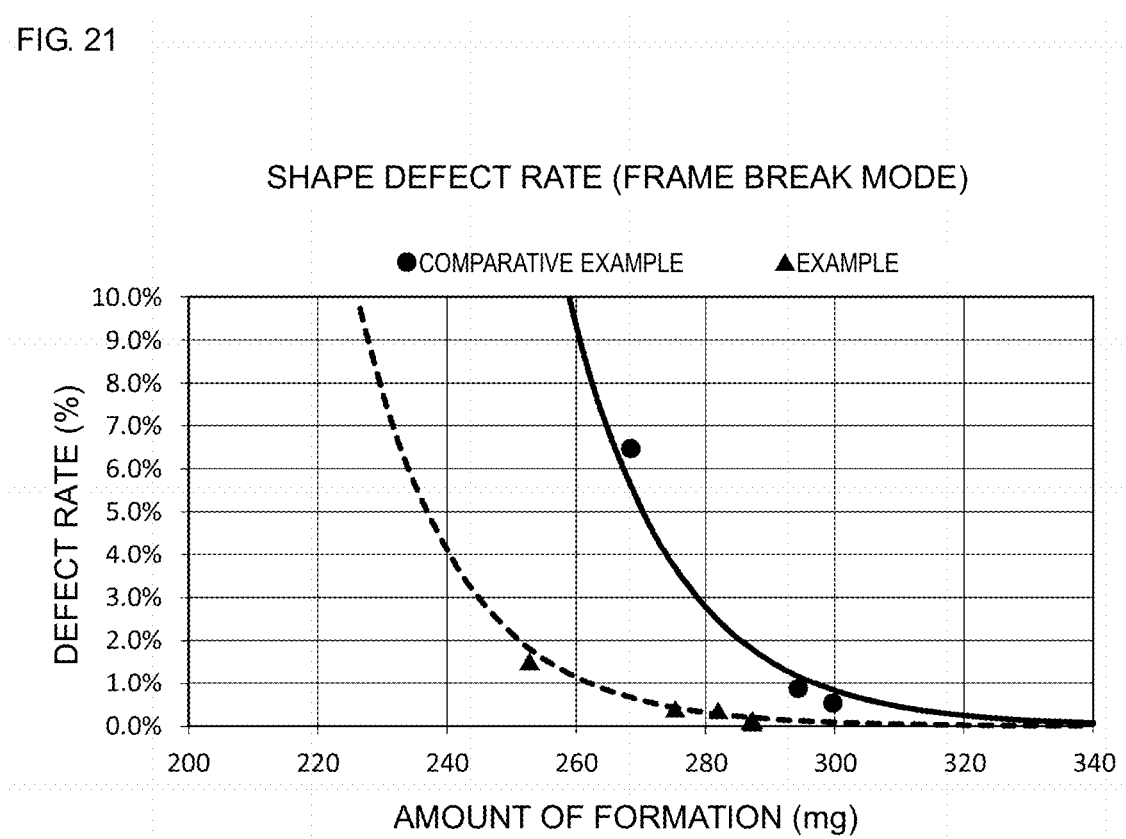
FIG. 21 is a graph that shows the shape defect rates of joining members due to a shortage of joining member paste.

Evaluation results on the planar shape of the joining member 540 as a sealing frame will be described with reference to FIG. 20 and FIG. 21. FIG. 20 is a graph that shows the shape defect rates of joining members due to an excess of joining member paste. FIG. 21 is a graph that shows the shape defect rates of joining members due to a shortage of joining member paste. In FIG. 20 and FIG. 21, the abscissa axis of each graph represents the mass (hereinafter, referred to as the amount of formation) of 2400 joining members 540. This was calculated based on a mass change when the 2400 joining members 540 were provided on a collective board. In FIG. 20 and FIG. 21, the ordinate axis of each graph represents the defect rates of joining members 540 determined as shape defects out of the 2400 joining members 540. The ordinate axis of FIG. 20 represents the rate of shape defects that the joining member 540 concentrates at corner portions, and the rate of shape defects is referred to as shape defect rate (solder stagnation mode). The ordinate axis of FIG. 21 represents the rate of shape defects that the joining member 540 narrows at a side portion or breaks, and the rate of shape defects is referred to as shape defect rate (frame break mode). Solid circle marks represent data of Comparative Example. Solid triangle marks represent data of Example.

On a collective board before singulation into the first boards 530, 2400 base members 537 having a substantially rectangular ring shape in plan view with a width of 100 μm were provided. Each of the base members 537 had a length of 1.5 mm in the long-side direction, a length of 1.1 mm in the short-side direction, and an area of 0.5 mm². A photo contour image of a portion corresponding to the joining member 540 was obtained by binarizing image data captured with a camera in plan view of the electronic component 502 as shown in FIG. 18. Then, the photo contour image of the portion corresponding to the joining member 540 was divided into eight sections composed of four corner portions and four side portions and then compared. When the area of a reference contour image that corresponds to a geometrical reference contour image of the joining member 540 in any one of the sections was less than or equal to 60% of the area of the original reference contour image, the joining member 540 was determined as a defect, and the shape defect rate was calculated.

As shown in FIG. 20, when the amount of formation of the joining member 540 was 280 mg, the shape defect rate (solder stagnation mode) of Example was about 0.1%, and the shape defect rate (solder stagnation mode) of Comparative Example was about 4.0%. In addition, when the amount of formation of the joining member 540 was 300 mg, the shape defect rate (solder stagnation mode) of Example was about 1.0%, and the shape defect rate (solder stagnation mode) of Comparative Example was about 15%. In any condition, the defect rate of Comparative Example was higher than or equal to ten times of the defect rate of Example. As shown in FIG. 21, when the amount of formation of the joining member 540 was 260 mg, the shape defect rate (frame break mode) of Example was about 1.0%, and the shape defect rate (frame break mode) of Comparative Example was about 9.0%.

These results demonstrate that, when the embodiments of the present invention are applied, the influence of softening at the time of solidification is reduced and the joining member 540 with a small shape change is obtained. In Example, to manufacture the joining member 540 such that the shape defect rate (solder stagnation mode) is lower than or equal to 10% and the shape defect rate (frame break mode) is lower than or equal to 1.0%, the amount of formation of the joining member 540 needs to be adjusted to greater than 260 mg and less than 360 mg. In contrast, in Comparative Example, to manufacture the joining member 540 such that the shape defect rate (solder stagnation mode) is lower than or equal to 10% and the shape defect rate (frame break mode) is lower than or equal to 1.0%, the amount of formation of the joining member 540 needs to be adjusted to substantially 290 mg. In this way, according to the embodiments of the present invention, the shapes of joining members are stable, so an allowable range of variations in manufacturing conditions on the amount of formation of a joining member is widened.

(Surface Shape Evaluation)

Figure 22:
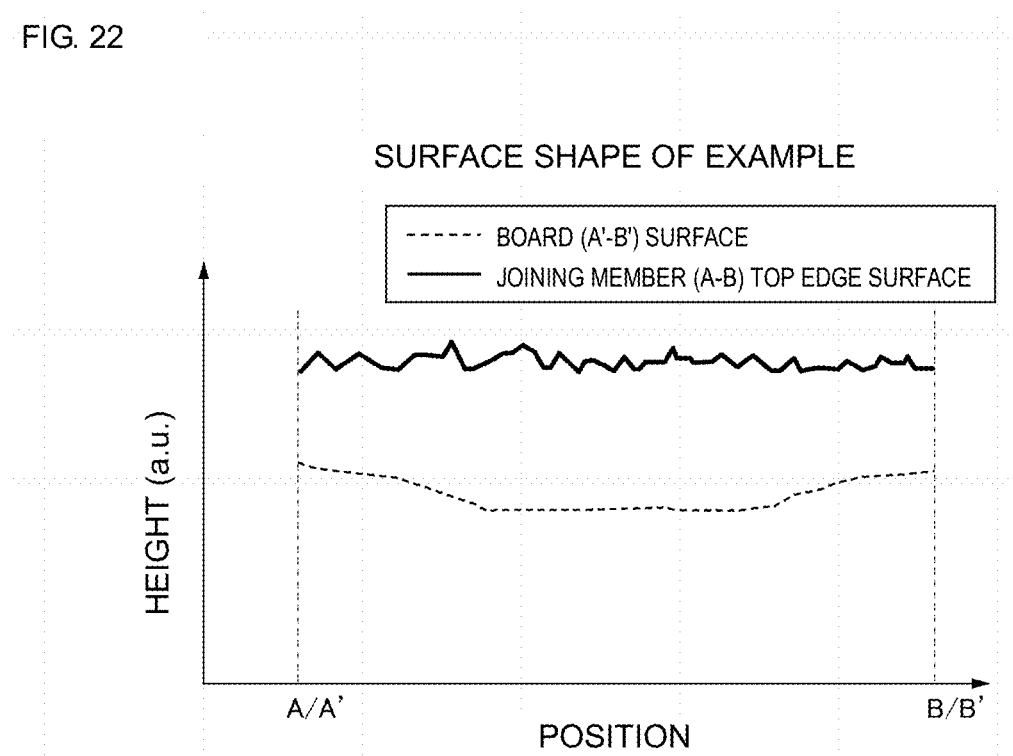
FIG. 22 is a view that shows a surface shape along the line A-B and a surface shape along the line A'-B', of the electronic component shown in FIG. 18.
Figure 23:
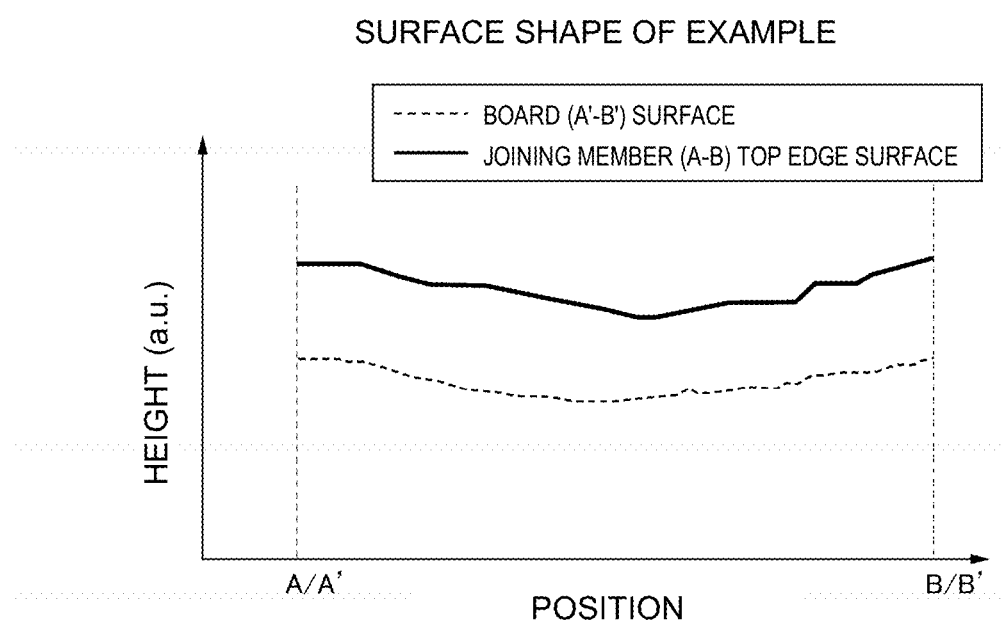
FIG. 23 is a view that shows a surface shape at a position corresponding to the line A-B and a surface shape at a position corresponding to the line A'-B' in the configuration in which joining member paste was applied on the base member and dried as Comparative Example.

Evaluation results on the planar shape of the joining member 540 as a sealing frame will be described with reference to FIG. 22 and FIG. 23. FIG. 22 is a view that shows a surface shape along the line A-B and a surface shape along the line A'-B', of the electronic component shown in FIG. 18. FIG. 23 is a view that shows a surface shape at a position corresponding to the line A-B and a surface shape at a position corresponding to the line A'-B' in the configuration in which joining member paste was applied on the base member and dried. In FIGS. 20 and 21, the abscissa axis of each graph represents a measured position. Moreover, in FIGS. 22 and 23, the ordinate axis of each graph represents a relative value of height. The broken lines represent data of Comparative Example, and the continuous lines represent data of Example.

As shown in FIG. 22, in Example, the surface shape of the first main surface 532a of the first board 530 was a downward convex shape such that the center portion was low and both end portions were high. The shape of the top edge portion 540a of the joining member 540 had a small change in the shape of the first main surface 532a of the first board 530 that is a base and had a small flatness. Table 1 below shows the flatness of a board (the flatness of a surface along the line A'-B'), the flatness of a joining member (the flatness of a surface along the line A-B), and the ratio in Samples 1 to 5. The ratio is the ratio of the flatness of the top edge portion 540a of the joining member 540 to the flatness of the first main surface 532a of the first board 530 (Flatness of the joining member/Flatness of the board).

TABLE 1

| Sample | Flatness of Board | Flatness of Joining Member | Ratio |
|---|---|---|---|
| 1 | 11.2 | 3.1 | 27.5% |
| 2 | 14.4 | 2.9 | 20.2% |
| 3 | 11.5 | 3.8 | 33.4% |
| 4 | 13.1 | 1.8 | 13.4% |
| 5 | 12.9 | 4.8 | 37.2% |
| Mean | 12.5 | 2.9 | 26.4% |

As shown in FIG. 22, in the Surface Shape of Example, the shape of the surface along the line A'-B' corresponding to the first main surface 532a of the first board 530 was a downward convex shape such that the center portion was low and both end portions were high. Because the shape of the top edge portion 540a of the joining member 540 also follows a change in the shape of the first main surface 532a of the first board 530 that is a base, the shape of the top edge portion 540a of the joining member 540 was similarly a downward convex shape. Table 2 below shows data in the case of Comparative Example.

TABLE 2

| Sample | Flatness of Board | Flatness of Joining Member | Ratio |
|---|---|---|---|
| 1 | 18.0 | 13.6 | 75.4% |
| 2 | 18.9 | 13.4 | 70.8% |
| 3 | 19.7 | 9.8 | 49.4% |
| 4 | 18.4 | 10.2 | 55.6% |
| 5 | 17.9 | 11.4 | 63.4% |
| Mean | 18.7 | 11.7 | 62.9% |

In the Example, the ratio of the flatness was a mean of 26.4%, a minimum of 13.4%, and a maximum of 37.2%. In a Comparative Example, the ratio of the flatness was a mean of 62.9%, a minimum of 49.5%, and a maximum of 75.4%. In the Example, the flatness of the board was 12.5 μm, and the mean of the flatness of the joining member was 3.3 μm. In the Comparative Example, the flatness of the board was 18.7 μm, and the mean of the flatness of the joining member was 11.7 μm. In this way, it is desirable that the flatness of the top edge portion 540a be less than or equal to 40% of the flatness of the first main surface 532a of the first board 530. In addition, the flatness of the top edge portion 540a is desirably less than or equal to 9.0 μm, and more desirably less than or equal to 5.0 μm. At this time, the flatness of the first main surface 532a of the first board 530 is greater than or equal to 10 μm. That is, even when the flatness of the first main surface 532a is greater than or equal to 10 μm, the shape of the joining member 540 is stabilized and the joining strength is improved according to Example.

(Cross-Sectional Shape Evaluation)

Figure 24:
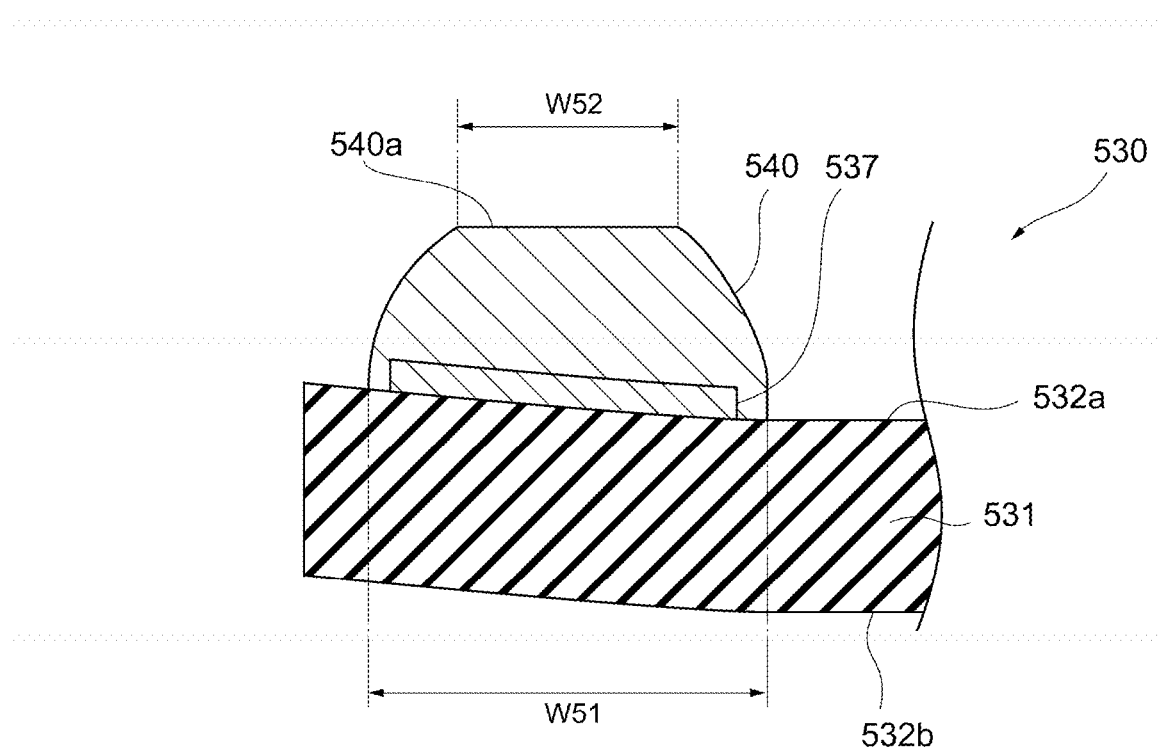
FIG. 24 is an enlarged cross-sectional view of the joining member in the electronic component shown in FIG. 18.
Figure 25:
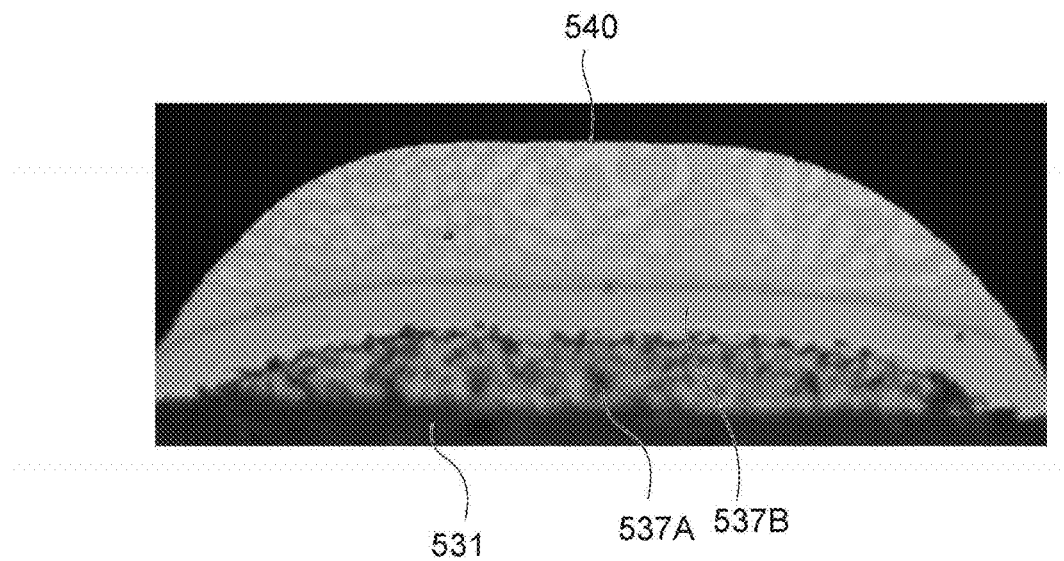
FIG. 25 is a photograph of a cross section of the joining member in the electronic component according to the second embodiment.
Figure 26:
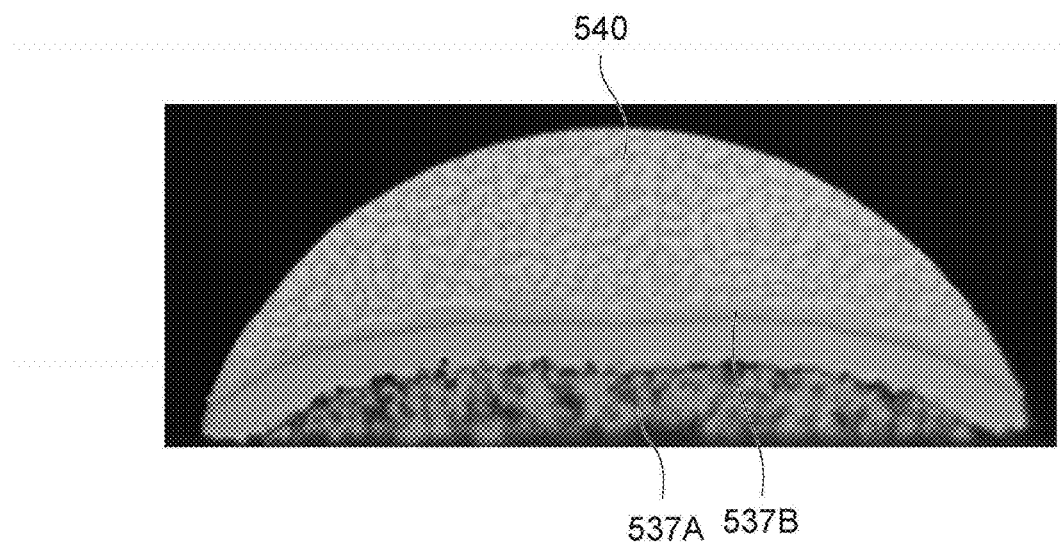
FIG. 26 is a photograph of a cross section of the joining member in the configuration in which joining member paste was applied on the base member and dried as Comparative Example.

Evaluation results on the cross-sectional shape of the joining member 540 will be described with reference to FIG. 24 to FIG. 26. FIG. 24 is an enlarged cross-sectional view of the joining member in the electronic component shown in FIG. 18. FIG. 25 is a photograph of a cross section of the joining member in the electronic component according to the second embodiment. FIG. 26 is a photograph of a cross section of the joining member in the configuration in which joining member paste was applied on the base member and dried as Comparative Example. FIG. 25 and FIG. 26 are photographs of the cross sections corresponding to FIG. 24.

Table 3 below shows the width W51 of a first board 530-side bottom surface of the joining member 540, the width W52 of the top edge portion 540a, and the ratio (W52/W51) of the width W52 to the width W51 in Example. In the Comparative Example, since the width of the top edge portion is substantially zero as shown in FIG. 26, the description is omitted.

TABLE 3

| Sample | W51 | W52 | W52/W51 |
|---|---|---|---|
| 1 | 138.5 | 48.8 | 35% |
| 2 | 150.8 | 48.5 | 32% |
| 3 | 168.1 | 55.9 | 33% |
| 4 | 145.5 | 50.7 | 35% |
| 5 | 139.5 | 45.4 | 33% |
| Mean | 148.5 | 49.9 | 34% |

The width ratio W52/W51 was a mean of 34%, a minimum of 42%, and a maximum of 35%. In this way, it is desirable that the width W52 of the top edge portion 540a be greater than or equal to 30% of the width W51 of the first board 530-side bottom surface of the joining member 540.

(Adhesiveness Evaluation)

Figure 27:
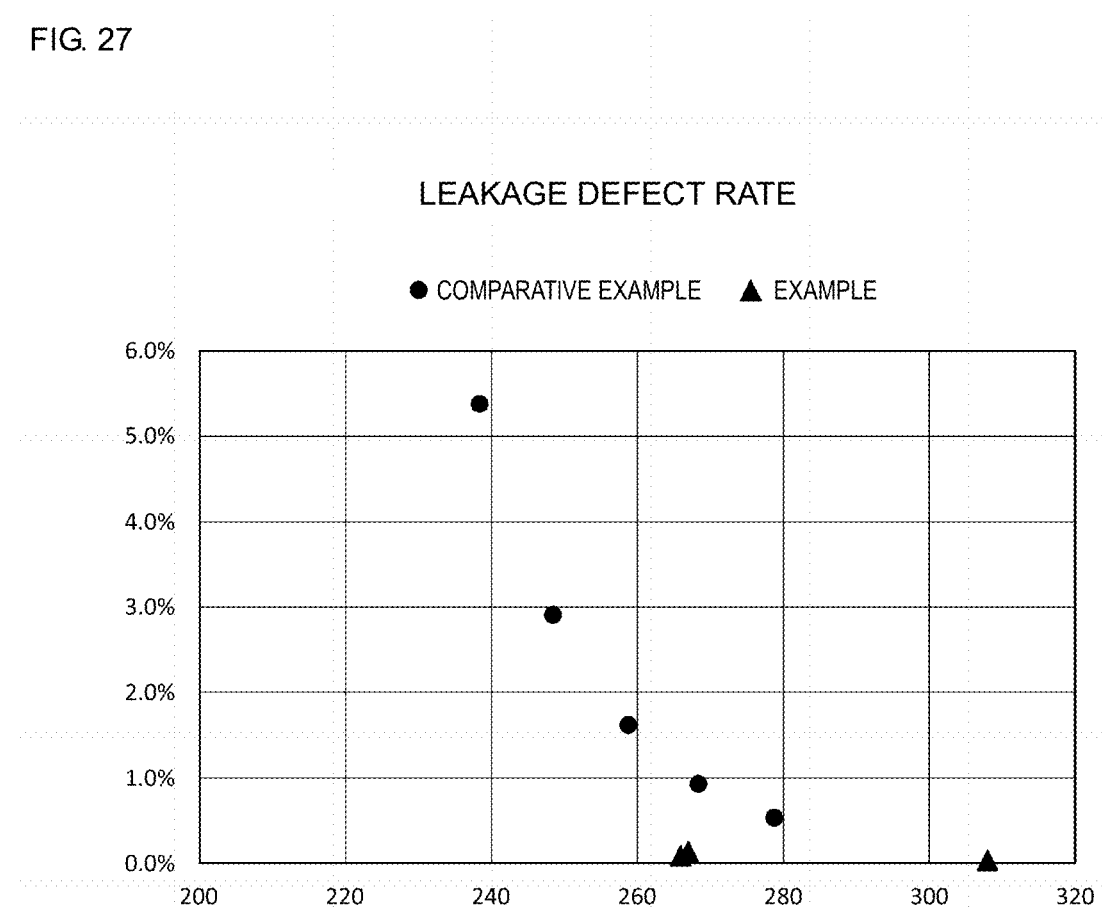
FIG. 27 is a graph that shows leakage defect rates when sealing is performed by the joining member in the electronic component according to the second embodiment.

Evaluation results on the adhesiveness between the first board 530 and the second board by the joining member 540 will be described with reference to FIG. 27. FIG. 27 is a graph that shows the rate of leakage defects when sealing is performed by the joining member in the electronic component according to the second embodiment. A leakage defect was determined by measuring a variation in the frequency characteristics of a quartz crystal resonator unit with a known method of measuring a leakage defect. The abscissa axis of the graph shown in FIG. 27 represents the amount of formation of the joining member 540. The ordinate axis of the graph shown in FIG. 27 represents a leakage defect rate when the joining member 540 was used as a sealing frame. Solid circle marks represent data of the Comparative Example. Solid triangle marks represent data of the Example.

As shown in FIG. 27, the leakage defect rates of the Example are lower than the leakage defect rates of the Comparative Example. Particularly, it appears that, near 265 mg that is the condition in which the amount of formation of the joining member 540 is small, the leakage defect rate of the Comparative Example is about 1.0% and the leakage defect rate of the Example is reduced to about 0.2%. That is, it is understood that leakage defects were reduced in the Example as compared to those in the Comparative Example.

From the above evaluation results, the following conclusions have been made. That is, in the Comparative Example, when the amount of formation of the joining member 540 becomes greater than 300 mg, there arises inconvenience that the shape defect rate (solder stagnation mode) of the Comparative Example becomes higher than or equal to 10%. In addition, as the amount of formation of the joining member 540 increases, the height of the joining member 540 also increases. This restricts a reduction in the profile of the electronic component 502. According to an approximate curve of the shape defect rate (solder stagnation mode) of the Example, the shape defect rate (solder stagnation mode) becomes higher than or equal to 10% when the amount of formation of the joining member 540 is greater than 360 mg. Therefore, to reduce leakage defects, the amount of formation of the joining member 540 can be increased as compared to the Comparative Example within the range in which shape defects do not occur. From another viewpoint, in Example, leakage defects are reduced even when the amount of formation of the joining member 540 is small.

Therefore, the profile is reduced and the consumption of material is reduced in the Example as compared to the Comparative Example. Under the condition that the amount of formation of the joining member 540 becomes greater than or equal to 280 mg in the Comparative Example, the shape defect rate (solder stagnation mode) can be higher than 10%. Leakage test was carried out on selected electronic components 502 whose shape evaluation results were good, so leakage test was not carried out in the range in which the amount of formation of the joining member 540 was greater than or equal to 280 mg in the Comparative Example, under which an appropriate efficiency percentage was not ensured.

Third Embodiment

A manufacturing method for an electronic component according to a third embodiment will be described with reference to FIG. 28 and FIG. 29. FIG. 28 is a plan view that schematically shows the configuration of the electronic component according to the third embodiment. FIG. 29 is a cross-sectional view that schematically shows the configuration of a cross section taken along the line XXIX-XXIX in FIG. 28.

The electronic component 601 is manufactured by joining a second board 620 with an electronic component 602 including a first board 630, a plurality of first joining members 645, and a plurality of second joining members 646. The first board 630 includes a rewiring layer 681, an integrated circuit 682, and a mold layer 683. The rewiring layer 681 is provided at a first main surface 632a side of the first board 630. The integrated circuit 682 corresponds to an electric element. The integrated circuit 682 is provided on a side, adjacent to a second main surface 632b, of the rewiring layer 681. The mold layer 683 covers the integrated circuit 682.

Each of the plurality of first joining members 645 has a first top edge portion 645a. Each of the plurality of second joining members 646 has a second top edge portion 646a. When the first main surface 632a of the first board 630 is viewed in plan, the first joining member 645 and the second joining member 646 are different from each other in shape or size. The first top edge portion 645a and the second top edge portion 645c are different from each other in shape or size. Each of the first joining members 645 and the second joining members 646 is provided so as to be disposed on top of a plurality of base members 637. Specifically, the three or more base members 637 that are configured to function as part of an electrode pad of the electronic component electrically connect the integrated circuit 682 to the first joining members 645 and the second joining members 646 through the rewiring layer 681.

Preferably, the top edge portions 645a and the top edge portions 646a have similar configurations to those of the top edge portion 530a of the joining member 540 according to the second embodiment. That is, the top edge portions 645a and the top edge portions 646a are exposed and have a planar shape. At this time, it is desirable that the width of each of the top edge portions 645a and the top edge portions 646a be higher than or equal to 30% of the width of the first board 630-side bottom surface of a corresponding one of the joining members 645, 646. The top edge portions 645a and the top edge portions 646a are provided in an imaginary plane. The flatness of each of the top edge portions 645a and the top edge portions 646a is less than or equal to 40% of the flatness of the first main surface 632a of the first board 630. The flatness of each of the top edge portions 645a and the top edge portions 646a is less than or equal to 9.0 μM, and is desirably less than or equal to 5.0 μm.

APPENDICES

Hereinafter, part or all of the exemplary embodiments of the present invention will be described as appendices. It is noted that the present invention is not limited to the following appendices.

A manufacturing method for an electronic component includes a first process of providing a base member on a first main surface of a first board, a second process of sandwiching the base member and joining member paste by the first main surface of the first board and a transfer main surface of a transfer board, a third process of forming a joining member joined with the base member while the joining member paste is sandwiched by the first board and the transfer board, and a fourth process of peeling off the transfer board from the joining member joined with the base member.

In the manufacturing method for an electronic component, the third process includes a process of heating the joining member paste, and a process of cooling the joining member after the heating process.

A manufacturing method for an electronic component includes a first process of providing a base member on a first main surface of a first board, a second process of sandwiching the base member and joining member paste provided on the base member by the first main surface of the first board and a transfer main surface of a transfer board, a third process of forming a joining member through softening and solidification of the joining member paste by heating and cooling the joining member paste while the joining member paste is sandwiched by the first board and the transfer board, and a fourth process of peeling off the transfer board from the joining member joined with the base member.

In the manufacturing method for an electronic component, the second process includes a process of providing the joining member paste on the transfer main surface of the transfer board.

In the manufacturing method for an electronic component, in the fourth process, a joining strength between the transfer board and the joining member is less than a joining strength between the base member and the joining member.

In the manufacturing method for an electronic component, in the fourth process, a joining strength between the transfer board and the joining member is less than a joining strength between the first board and the base member.

In the manufacturing method for an electronic component, in the fourth process, a joining strength between the transfer board and the joining member is the least among joining strengths between the first board and the transfer board.

In the manufacturing method for an electronic component, the joining member paste contains metal and flux.

In the manufacturing method for an electronic component, the joining member is made of metal.

In the manufacturing method for an electronic component, in the third process, the base member and the joining member form metal joining.

In the manufacturing method for an electronic component, in the third process, flux contained in the joining member paste covers the joining member.

The manufacturing method for an electronic component further includes a process of removing the flux.

In the manufacturing method for an electronic component, the transfer main surface of the transfer board is made of a nonmetallic material.

In the manufacturing method for an electronic component, the transfer board is made of ceramics.

In the manufacturing method for an electronic component, the transfer board is made of glass.

In the manufacturing method for an electronic component, the transfer main surface of the transfer board is lower in surface roughness than the first main surface of the first board.

In the manufacturing method for an electronic component, the transfer main surface of the transfer board is less in flatness than the first main surface of the first board.

In the manufacturing method for an electronic component, in the second process, a region facing the first main surface of the first board via the joining member paste on the transfer main surface of the transfer board is less in flatness than the first main surface of the first board.

In the manufacturing method for an electronic component, in the first process, a plurality of the base members is provided, and, in the third process, each of a plurality of the joining members is formed in contact with a corresponding one of the plurality of base members.

In the manufacturing method for an electronic component, the plurality of joining members includes a first joining member and a second joining member, and the second joining member is different in shape or size from the first joining member when the first main surface of the first board is viewed in plan.

In the manufacturing method for an electronic component, in the second process, when the first main surface of the first board is viewed in plan, the joining member paste is provided so as to coincide in shape with the base member.

In the manufacturing method for an electronic component, wettability of the joining member paste against the base member is higher than wettability of the joining member paste against the transfer main surface of the transfer board.

In the manufacturing method for an electronic component, wettability of the joining member paste against the base member is higher than wettability of the joining member paste against the first main surface of the first board.

In the manufacturing method for an electronic component, in the fourth process, a shape of the transfer main surface of the transfer board is transferred to a top edge portion of the joining member.

In the manufacturing method for an electronic component, in the first process, the base member is provided in a ring shape when the first main surface of the first board is viewed in plan.

In the manufacturing method for an electronic component, in the first process, the base member is provided in a rectangular ring shape when the first main surface of the first board is viewed in plan, and, in the second process, the joining member paste is provided except corner portions of the rectangular ring shape of the base member when the first main surface of the first board is viewed in plan.

The manufacturing method for an electronic component further includes a fifth process of joining the first board with the second board with the base member and the joining member interposed between the first board and the second board.

In the manufacturing method for an electronic component, in the fifth process, an internal space surrounded by the base member and the joining member is formed between the first board and the second board.

The manufacturing method for an electronic component further includes a process of providing an electronic element on or in the first board.

In the manufacturing method for an electronic component, the electronic element is disposed in the sealed internal space.

In the manufacturing method for an electronic component, the electronic element is a piezoelectric resonator having a substantially rectangular shape when the first main surface of the first board is viewed in plan.

In the manufacturing method for an electronic component, the electronic element is a tuning fork-type quartz crystal resonator having a plurality of vibration arm portions.

In the manufacturing method for an electronic component, the base member includes a close contact layer that is in contact with the first board and a base layer located between the close contact layer and the joining member.

In the manufacturing method for an electronic component, the first process includes a process of providing a ceramic green sheet, a process of providing close contact layer paste on a first main surface of the green sheet, a process of forming the first board from the green sheet and forming the close contact layer from the close contact layer paste by firing the green sheet and the close contact layer paste, and a process of plating a base layer on the close contact layer to base member.

An electronic component includes a first board having a bow-shaped first main surface, and a joining member provided on or to the first main surface of the first board and having a top edge portion to be joined with a second board. The top edge portion of the joining member is provided in a plane.

An electronic component includes a first board having a first main surface and a joining member provided on or to the first main surface of the first board and having a top edge portion. The top edge portion of the joining member is exposed and has a planar shape.

In the electronic component, a flatness of the top edge portion is less than or equal to 40% of a flatness of the first main surface of the first board.

In the electronic component, a flatness of the top edge portion is less than or equal to 9.0 μm.

In the electronic component, the flatness of the top edge portion is less than or equal to 5.0 μm.

In the electronic component, a width of the top edge portion is greater than or equal to 30% of a width of a bottom surface of the joining member on a side adjacent to the first board.

In the electronic component, the first board is a ceramic board made of a sintered body, and a base member including a close contact layer is provided between the first main surface of the first board and the joining member.

In the electronic component, the close contact layer is a sintered metal and is in contact with the ceramic board.

In the electronic component, the first main surface of the first board has a bow shape.

In the electronic component, a flatness of the first main surface of the first board is greater than or equal to 10 μm.

In the electronic component, the joining member is provided in a ring shape when the first main surface of the first board is viewed in plan.

In the electronic component, the joining member is provided in a ring shape when the first main surface of the first board is viewed in plan.

In the electronic component, when the first main surface of the first board is viewed in plan, a plurality of the joining members different in shape or size is provided.

An electronic component includes a first board having a first main surface and a plurality of joining members provided on or to the first main surface of the first board and having at least three top edge portions. Moreover, a flatness of each of the at least three top edge portions is less than or equal to 40% of a flatness of the first main surface of the first board.

An electronic component includes a first board having a first main surface and a plurality of joining members provided on or to the first main surface of the first board and having at least three top edge portions. Moreover, a flatness of each of the at least three top edge portions is less than or equal to 9.0 μm.

In the electronic component, a flatness of each of the at least three top edge portions is less than or equal to 5.0 μm.

An electronic component includes a first board having a first main surface and a plurality of joining members provided on or to the first main surface of the first board and having at least three top edge portions. The at least three top edge portions are exposed and have a planar shape.

In the electronic component, a width of each of the at least three top edge portions is greater than or equal to 30% of a width of a bottom surface of each of the plurality of joining members on a side adjacent to the first board.

The electronic component further includes a base member provided between the first board and the joining member, and a joining strength between the joining member and the base member that is greater than a joining strength between the joining member and the first board.

In the electronic component, the joining member forms an alloy with the base member.

In the electronic component, a material of the joining member is only metal.

In the electronic component, the first board includes an electrode pad provided on the first main surface, and the joining member is disposed on the electrode pad.

In the electronic component, an electronic element is provided on or in the first board.

In the electronic component, the electronic element is a piezoelectric resonator.

In the electronic component, the electronic element is provided on or to the first main surface of the first board, and at least one of the joining member is provided in a frame shape surrounding the electronic element when the first main surface of the first board is viewed in plan.

As described above, according to the present invention, it is possible to provide a manufacturing method for an electronic component, which is able to stabilize the shape of a joining member.

It is noted that the exemplary embodiments described above are intended to easily understand the present invention, and are not intended to limit interpretation of the present invention. Accordingly, the present invention can be modified or improved without departing from the purport of the invention, and the present invention also encompasses equivalents thereof. That is, each of the embodiments with design changes made by persons skilled in the art as needed is also included in the scope of the present invention as long as it includes the characteristics of the present invention. For example, elements of each embodiment, the disposition, materials, conditions, shapes, sizes, and the like, of the elements are not limited to the illustrated ones, and may be changed as needed. The elements of each embodiment may be combined with one another as long as it is technically possible, and these combinations are also included in the scope of the present invention as long as they include the characteristics of the present invention.

REFERENCE SIGNS LIST 1 quartz crystal resonator unit
10 quartz crystal resonator
20 second board
21 top portion
22 side wall portion
23 facing surface
30, 130 first board
31, 131 substrate
32*a*, 132*a* first main surface
32*b*, 132*b* second main surface
33*a*, 33*b*, 133*a*, 133*b* electrode pad
37, 137 base member
151 transfer board
152*a* transfer main surface
160 metal mask
161 opening portion
161*a* first slit
161*b* second slit
161*c* third slit
161*d* fourth slit
163*a*, 163*b*, 163*c*, 163*d* bridge portion
165 squeegee
40, 140 joining member
141*a* first portion
141*b* second portion
141*c* third portion
141*d* fourth portion
143*a*, 143*b*, 143*c*, 143*d* corner portion

The invention claimed is:

1. A manufacturing method for an electronic component, comprising:
   providing a base member on a first main surface of a first board, with the base member having a rectangular ring shape when the first main surface of the first board is viewed in a plan view thereof;
   providing a joining member paste except in corner portions of the rectangular ring shape of the base member when the first main surface of the first board is viewed in the plan view thereof;
   sandwiching the base member and the joining member paste between the first main surface of the first board and a transfer main surface of a transfer board;
   while the joining member paste is sandwiched between the first board and the transfer board, forming a joining member joined with the base member by heating the joining member paste to change a metal component therein to a liquid state and subsequently changing the metal component from the liquid state to a solid state; and
   peeling off the transfer board from the formed joining member joined with the base member.

2. The manufacturing method for an electronic component according to claim 1, wherein the forming of the joining member comprises:
   heating the joining member paste to melt the metal component therein; and
   cooling the joining member after the heating of the joining member paste to subsequently change the metal component from the liquid state to the solid state.

3. The manufacturing method for an electronic component according to claim 1, wherein the forming of the joining member comprises forming the joining member through softening and solidification of the joining member paste by heating and cooling the joining member paste while the joining member paste is sandwiched between the first board and the transfer board.

4. The manufacturing method for an electronic component according to claim 1, wherein the sandwiching of the base member and the joining member paste includes providing the joining member paste on the transfer main surface of the transfer board.

5. The manufacturing method for an electronic component according to claim 1, wherein a joining strength between the transfer board and the joining member is less than a joining strength between the base member and the joining member.

6. The manufacturing method for an electronic component according to claim 1, wherein a joining strength between the transfer board and the joining member is less than a joining strength between the first board and the base member.

7. The manufacturing method for an electronic component according to claim 1, wherein a joining strength between the transfer board and the joining member is a lowest joining strength relative to joining strengths between the first board and the transfer board.

8. The manufacturing method for an electronic component according to claim 1, wherein the forming of the joining member comprises causing flux in the joining member paste to lie on an outer side portion of the metal component.

9. The manufacturing method for an electronic component according to claim 1, wherein the joining member comprises metal.

10. The manufacturing method for an electronic component according to claim 1, wherein the forming of the joining member comprises forming a metal joining from the base member and the joining member.

11. The manufacturing method for an electronic component according to claim 1, further comprising covering the joining member with flux contained in the joining member paste.

12. The manufacturing method for an electronic component according to claim 11, further comprising removing the flux.

13. The manufacturing method for an electronic component according to claim 1, wherein the transfer main surface of the transfer board comprises a nonmetallic material.

14. The manufacturing method for an electronic component according to claim 13, wherein the transfer board comprises a ceramic.

15. The manufacturing method for an electronic component according to claim 13, wherein the transfer board comprises glass.

16. The manufacturing method for an electronic component according to claim 1, wherein the transfer main surface of the transfer board comprises a surface roughness that is lower than a surface roughness of the first main surface of the first board.

17. The manufacturing method for an electronic component according to claim 1, wherein the transfer main surface of the transfer board comprises a flatness that is less than a flatness of the first main surface of the first board.

18. The manufacturing method for an electronic component according to claim 1, wherein during the sandwiching of the base member and the joining member paste, the method further comprises providing a region facing the first main surface of the first board via the joining member paste on the transfer main surface of the transfer board that has a flatness that is less than a flatness of the first main surface of the first board.

19. The manufacturing method for an electronic component according to claim 1, further comprising:
   providing a plurality of the base members; and
   forming each of a plurality of the joining members in contact with a corresponding one of the plurality of base members.

20. The manufacturing method for an electronic component according to claim 19, wherein the plurality of joining members includes a first joining member and a second joining member that is different in at least one of shape or size than the first joining member when the first main surface of the first board is viewed in a plan view thereof.

21. The manufacturing method for an electronic component according to claim 1, wherein, during the sandwiching of the base member and the joining member paste, the method comprise providing the joining member paste so as to coincide in shape with the base member in a plan view of the first main surface of the first board.

22. The manufacturing method for an electronic component according to claim 1, wherein a wettability of the joining member paste against the base member is higher than a wettability of the joining member paste against the transfer main surface of the transfer board.

23. The manufacturing method for an electronic component according to claim 1, wherein a wettability of the joining member paste against the base member is higher than a wettability of the joining member paste against the first main surface of the first board.

24. The manufacturing method for an electronic component according to claim 1, wherein the peeling off the transfer board includes transferring a shape of the transfer main surface of the transfer board to a top edge of the joining member.

25. The manufacturing method for an electronic component according to claim 1, further comprising:
   joining the first board with a second board with the base member and the joining member interposed between the first and second boards.

26. The manufacturing method for an electronic component according to claim 25, further comprising forming an internal space surrounded by the base member and the joining member between the first and second boards.

27. The manufacturing method for an electronic component according to claim 26, further comprising providing an electronic element on or in the first board, such that the electronic element is disposed in the internal space sealed by the first and second boards.

28. The manufacturing method for an electronic component according to claim 27, wherein the electronic element is a piezoelectric resonator having a substantially rectangular shape when the first main surface of the first board is viewed in a plan view thereof.

29. The manufacturing method for an electronic component according to claim 27, wherein the electronic element is a tuning fork-type quartz crystal resonator having a plurality of vibration arms.

30. The manufacturing method for an electronic component according to claim 1, wherein the base member includes a close contact layer that is in contact with the first board and a base layer disposed between the close contact layer and the joining member.

\* \* \* \* \*